(12) United States Patent
Yamazaki et al.

(10) Patent No.: US 7,745,991 B2
(45) Date of Patent: Jun. 29, 2010

(54) ELECTRO-OPTICAL DEVICE HAVING AN EL LAYER OVER A PLURALITY OF PIXELS

(75) Inventors: Shunpei Yamazaki, Tokyo (JP); Kunitaka Yamamoto, Kanagawa (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/885,953

(22) Filed: Jul. 8, 2004

(65) Prior Publication Data

US 2005/0035708 A1 Feb. 17, 2005

Related U.S. Application Data

(62) Division of application No. 09/680,492, filed on Oct. 6, 2000, now Pat. No. 6,830,494.

(30) Foreign Application Priority Data

Oct. 12, 1999 (JP) .................................. 11-290314

(51) Int. Cl.
*H01J 1/62* (2006.01)
(52) U.S. Cl. ........................ 313/506; 313/500; 313/509
(58) Field of Classification Search .......... 313/498–512
See application file for complete search history.

(56) References Cited

U.S. PATENT DOCUMENTS

| 4,356,429 A | 10/1982 | Tang |
| 4,530,750 A | 7/1985 | Aisenberg et al. |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |

(Continued)

FOREIGN PATENT DOCUMENTS

CN 1212114 3/1999

(Continued)

OTHER PUBLICATIONS

Office Action of Chinese Patent Application No. 00130499.2, Dated: Jan. 2, 2004.

(Continued)

*Primary Examiner*—Bumsuk Won
(74) *Attorney, Agent, or Firm*—Nixon Peabody LLP; Jeffrey L. Costellia

(57) ABSTRACT

The present invention aims to provide simple, high-speed processing for the formation of an EL layer by an ink-jet method. A method of manufacturing an electro-optical device having good operation performance and high reliability, and in particular, a method of manufacturing an EL display device, is provided. The present invention forms EL layers continuously across a plurality of pixels when the EL layers are formed by the ink-jet method. Specifically, with respect to m columns and n rows of pixel electrodes arranged in a matrix state, the EL layers are formed so as to form stripes with respect to one certain selected row or one column. The EL layers may also be formed having an oblong shape or a rectangular shape with respect to each pixel electrode.

55 Claims, 19 Drawing Sheets

U.S. PATENT DOCUMENTS

| | | | |
|---|---|---|---|
| 4,950,950 A | 8/1990 | Perry et al. |
| 4,975,338 A | 12/1990 | Kageyama et al. |
| 5,003,221 A | 3/1991 | Shimizu |
| 5,047,687 A | 9/1991 | VanSlyke |
| 5,059,861 A | 10/1991 | Littman et al. |
| 5,059,862 A | 10/1991 | VanSlyke et al. |
| 5,061,617 A | 10/1991 | Maskasky |
| 5,073,446 A | 12/1991 | Scozzafava et al. |
| 5,107,175 A | 4/1992 | Hirano et al. |
| 5,124,204 A | 6/1992 | Yamashita et al. |
| 5,151,629 A | 9/1992 | VanSlyke |
| 5,189,405 A | 2/1993 | Yamashita et al. |
| 5,217,700 A | 6/1993 | Kurihara et al. |
| 5,247,190 A | 9/1993 | Friend et al. |
| 5,270,267 A | 12/1993 | Ouellet |
| 5,294,869 A | 3/1994 | Tang et al. |
| 5,294,870 A | 3/1994 | Tang et al. |
| 5,338,364 A | 8/1994 | Kurihara et al. |
| 5,399,502 A | 3/1995 | Friend et al. |
| 5,438,241 A | 8/1995 | Zavracky et al. |
| 5,482,896 A | 1/1996 | Tang |
| 5,496,597 A | 3/1996 | Soininen et al. |
| 5,530,269 A | 6/1996 | Tang |
| 5,550,066 A | 8/1996 | Tang et al. |
| 5,552,668 A | 9/1996 | Hirose et al. |
| 5,641,991 A | 6/1997 | Sakoh |
| 5,643,826 A | 7/1997 | Ohtani et al. |
| 5,674,304 A | 10/1997 | Fukada et al. |
| 5,680,165 A | 10/1997 | Takizawa et al. |
| 5,680,185 A | 10/1997 | Kobayashi et al. |
| 5,684,365 A | 11/1997 | Tang et al. |
| 5,686,360 A | 11/1997 | Harvey et al. |
| 5,688,551 A | 11/1997 | Littman et al. |
| 5,693,956 A | 12/1997 | Shi et al. |
| 5,747,930 A | 5/1998 | Utsugi |
| 5,757,126 A | 5/1998 | Harvey et al. |
| 5,771,562 A | 6/1998 | Harvey et al. |
| 5,811,177 A | 9/1998 | Shi et al. |
| 5,824,374 A | 10/1998 | Bradley, Jr. et al. |
| 5,839,456 A | 11/1998 | Han |
| 5,853,905 A | 12/1998 | So et al. |
| 5,882,761 A | 3/1999 | Kawami et al. |
| 5,889,459 A | 3/1999 | Hattori et al. |
| 5,895,692 A | 4/1999 | Shirasaki et al. |
| 5,923,962 A | 7/1999 | Ohtani et al. |
| 5,929,487 A | 7/1999 | Fukada et al. |
| 5,952,708 A | 9/1999 | Yamazaki |
| 5,952,778 A | 9/1999 | Haskal et al. |
| 5,962,897 A | 10/1999 | Takemura et al. |
| 5,962,962 A | 10/1999 | Fujita et al. |
| 5,990,542 A | 11/1999 | Yamazaki |
| 6,028,325 A | 2/2000 | Yamazaki |
| 6,057,647 A | 5/2000 | Kurosawa et al. |
| 6,097,459 A | 8/2000 | Shimada et al. |
| 6,100,954 A | 8/2000 | Kim et al. |
| 6,115,090 A | 9/2000 | Yamazaki |
| 6,129,602 A | 10/2000 | Yamanobe |
| 6,146,225 A | 11/2000 | Sheats et al. |
| 6,150,187 A | 11/2000 | Zyung et al. |
| 6,150,668 A | 11/2000 | Bao et al. |
| 6,169,293 B1 | 1/2001 | Yamazaki |
| 6,194,837 B1 | 2/2001 | Ozawa |
| 6,198,217 B1 | 3/2001 | Suzuki et al. |
| 6,198,220 B1 | 3/2001 | Jones et al. |
| 6,239,470 B1 | 5/2001 | Yamazaki |
| 6,251,712 B1 | 6/2001 | Tanaka et al. |
| 6,268,631 B1 | 7/2001 | Fukada et al. |
| 6,268,695 B1 | 7/2001 | Affinito |
| 6,268,842 B1 | 7/2001 | Yamazaki et al. |
| 6,274,887 B1 | 8/2001 | Yamazaki et al. |
| 6,278,132 B1 | 8/2001 | Yamazaki et al. |
| 6,281,634 B1 | 8/2001 | Yokoyama |
| 6,283,578 B1 | 9/2001 | Popall et al. |
| 6,316,810 B1 | 11/2001 | Yamazaki et al. |
| 6,380,672 B1 | 4/2002 | Yudasaka |
| 6,399,222 B2 | 6/2002 | Arai et al. |
| 6,413,645 B1 | 7/2002 | Graff et al. |
| 6,416,885 B1 * | 7/2002 | Towns et al. ............... 428/690 |
| 6,441,468 B1 | 8/2002 | Yamazaki |
| 6,445,059 B1 | 9/2002 | Yamazaki |
| 6,455,875 B2 | 9/2002 | Takemura et al. |
| 6,461,885 B1 * | 10/2002 | Lupo et al. ................. 438/29 |
| 6,518,102 B1 | 2/2003 | Tanaka et al. |
| 6,531,713 B1 | 3/2003 | Yamazaki |
| 6,575,800 B1 | 6/2003 | Kobayashi et al. |
| 6,787,887 B2 | 9/2004 | Yamazaki |
| 6,790,749 B2 | 9/2004 | Takemura et al. |
| 6,843,937 B1 | 1/2005 | Kiguchi et al. |
| 7,015,503 B2 | 3/2006 | Seki et al. |
| 7,034,381 B2 | 4/2006 | Yamazaki |
| 7,109,108 B2 | 9/2006 | Takemura et al. |
| 7,115,434 B2 | 10/2006 | Yamazaki et al. |
| 7,202,551 B2 | 4/2007 | Yamazaki |
| 7,214,959 B2 | 5/2007 | Seki et al. |
| 7,273,801 B2 | 9/2007 | Seki et al. |
| 7,288,420 B1 | 10/2007 | Yamazaki et al. |
| 7,413,937 B2 | 8/2008 | Yamazaki |
| 7,442,955 B2 | 10/2008 | Seki et al. |
| 2001/0001050 A1 | 5/2001 | Miyashita et al. |
| 2001/0026127 A1 * | 10/2001 | Yoneda et al. ............. 313/506 |
| 2001/0041268 A1 | 11/2001 | Arai et al. |
| 2001/0049030 A1 * | 12/2001 | Okada et al. ............... 428/690 |
| 2002/0009536 A1 | 1/2002 | Iguchi et al. |
| 2002/0041926 A1 | 4/2002 | Miyashita et al. |
| 2002/0075422 A1 | 6/2002 | Kimura et al. |
| 2002/0089282 A1 * | 7/2002 | Kijima et al. .............. 313/506 |
| 2002/0136823 A1 | 9/2002 | Miyashita et al. |
| 2002/0155215 A1 | 10/2002 | Miyashita et al. |
| 2003/0054186 A1 * | 3/2003 | Miyashita et al. ......... 428/500 |
| 2005/0012445 A1 | 1/2005 | Yamazaki et al. |
| 2006/0210704 A1 | 9/2006 | Kimura et al. |
| 2009/0020751 A1 | 1/2009 | Seki et al. |
| 2009/0053396 A1 | 2/2009 | Kimura et al. |

FOREIGN PATENT DOCUMENTS

| | | |
|---|---|---|
| EP | 0 491 521 A2 | 6/1992 |
| EP | 0 684 753 A1 | 11/1995 |
| EP | 0 717 445 A2 | 6/1996 |
| EP | 0 717 446 A2 | 6/1996 |
| EP | 0 776 147 A1 | 5/1997 |
| EP | 0 781 075 A1 | 6/1997 |
| EP | 0 862 156 A1 | 9/1998 |
| EP | 0 880 303 A1 | 11/1998 |
| EP | 0 892 028 A2 | 1/1999 |
| EP | 0 940 797 A1 | 9/1999 |
| EP | 0 961 525 A1 | 12/1999 |
| EP | 0 989 778 A1 | 3/2000 |
| EP | 0 999 595 A2 | 5/2000 |
| EP | 1 365 276 A2 | 11/2003 |
| EP | 1 365 443 A2 | 11/2003 |
| EP | 1 367 431 A2 | 12/2003 |
| EP | 1 793 650 A2 | 6/2007 |
| JP | 52-122092 | 10/1977 |
| JP | 62-090260 | 4/1987 |
| JP | 05-116297 | 5/1993 |
| JP | 05-266522 A | 10/1993 |
| JP | 07-014678 | 1/1995 |
| JP | 07-092467 | 4/1995 |
| JP | 07-130652 | 5/1995 |
| JP | 07-235378 | 9/1995 |
| JP | 08-078159 | 3/1996 |
| JP | 08-078519 | 3/1996 |
| JP | 08-234683 | 9/1996 |

| | | |
|---|---|---|
| JP | 08-241048 | 9/1996 |
| JP | 08-290647 | 11/1996 |
| JP | 08-330602 | 12/1996 |
| JP | 09-148066 | 6/1997 |
| JP | 09-223804 A | 8/1997 |
| JP | 10-012377 | 1/1998 |
| JP | 10-092576 A | 4/1998 |
| JP | 10-189252 | 7/1998 |
| JP | 10-189525 | 7/1998 |
| JP | 10-270363 | 10/1998 |
| JP | 11-074073 A | 3/1999 |
| JP | 11-195487 | 7/1999 |
| JP | 05-315360 A | 9/1999 |
| JP | 2000-340798 | 12/2000 |
| JP | 2001-343933 | 12/2001 |
| KR | 131061 B1 | 4/1998 |
| KR | 1999-013883 A | 2/1999 |
| WO | WO 90/13148 | 11/1990 |
| WO | WO-98/12689 A1 | 3/1998 |
| WO | WO-9824271 | 6/1998 |
| WO | WO 99/21233 | 4/1999 |
| WO | WO99/212333 | 4/1999 |
| WO | WO-99/48339 A1 | 9/1999 |

OTHER PUBLICATIONS

M.A. Baldo et al., "Applied Physics Letter", vol. 75, No. 1, pp. 4-6, Jul. 5, 1999.

Herman Schenk et al., "Polymers for Light Emitting Diodes", Eurodisplay '99, pp. 33-37, Sep. 6, 1999.

Tetsuo Tsutsui et al., Jpn. J. Appl. Phys. vol. 38, pp. L1502-L1504, (1999).

M.A. Baldo et al., Nature vol. 395, pp. 151-154, Sep. 10, 1998.

Tetsuo Tsutsui et al.., "Photochemical Processes in Organized Molecular Systems", pp. 437-450, Sep. 22, 1990.

Specification and Drawings for U.S. Appl. No. 09/580,485, "Method for Manufacturing an Electro-Optical Device", Filed; May 30, 2000.

U.S. Appl. No. 08/928,740, "Method of Using Phosphorous to Getter Crystallization Catalyst in a P-Type Device", Filed Sep. 12, 1997, pp. 1-15 of specification.

U.S. Appl. No. 08/928,750, 7 pages, Pending claims 39-50 and 85-92 as of Nov. 19, 2000.

U.S. Appl. No. 09/050,182, 8 pages, Pending claims 1-59, and 75-81 as of Aug. 1, 2000.

U.S. Appl. No. 09/050,182, "Method of Manufacturing a Semiconductor Device", pp. 1-54 of specification and 16 pages of drawings.

U.S. Appl. No. 09/528,113, "Electro-Optical Device and Manufacturing Method Thereof", pp. 1-52 of specification and 24 pages of drawings.

Specification and Drawings for U.S. Appl. No. 09/580,485, "Method for Manufacturing an Electro-Optical Device", Filed; May 30, 2000.

T. Shimoda et al., "Multicolor Pixel Patterning of Light-Emitting Polymers by Ink-Jet Printing", SID 99 Digest, pp. 376-379.

J. Kido et al., "White-Light-Emitting Organic Electroluminescent Device Using Lanthanide Complexes", Appl. Phys., vol. 35, pp. L394-L396, Mar. 1996.

M. Kimura et al., "TFT-LEPD with Image Uniformity by Area Ratio Gray Scale", EuroDisplay '99, The 19th International Display Research Conference, pp. 71-74, Sep. 6-9, 1999.

T. Shimoda et al., "Technology for Active Matrix Light Emitting Polymer Displays", IEDM 99, pp, 107-110, Dec. 5-8, 1999.

European Search Report (Application No. 00122181.1; EP4381) dated Jan. 22, 2007.

Office Action (Application No. 200610100216.0; CN4381D1D1) dated Mar. 20, 2009.

* cited by examiner

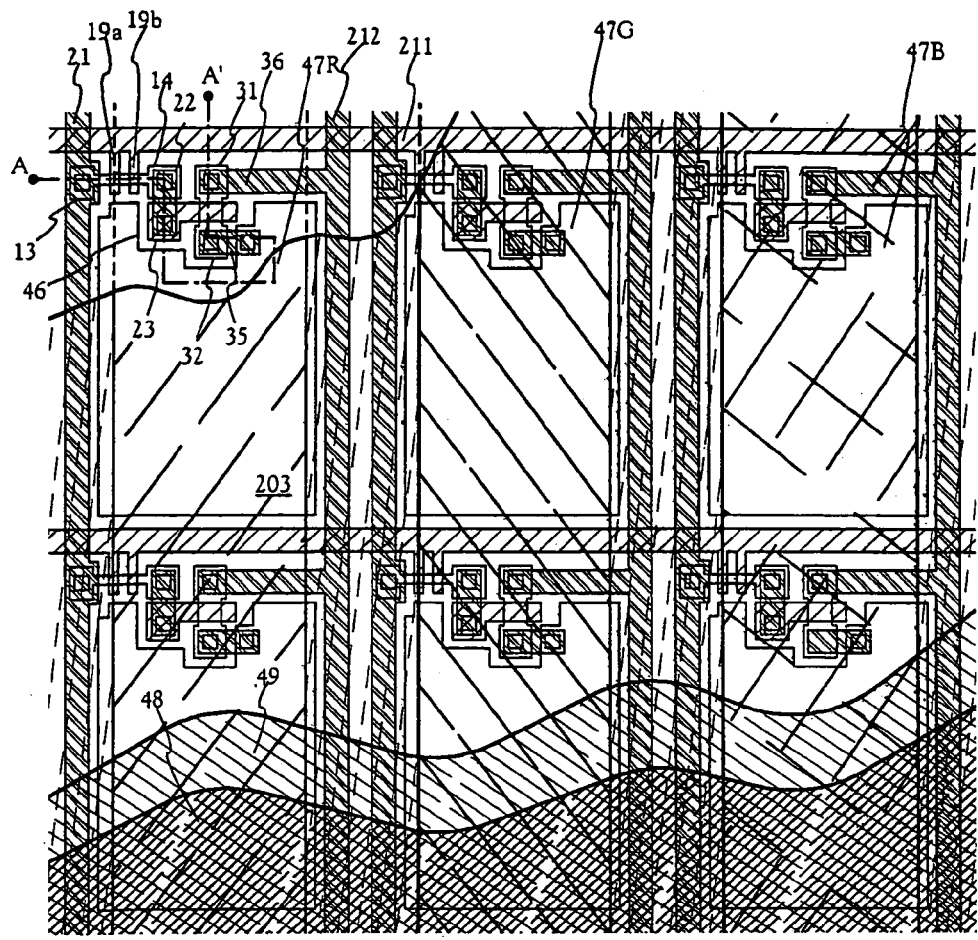
FIG. 6A
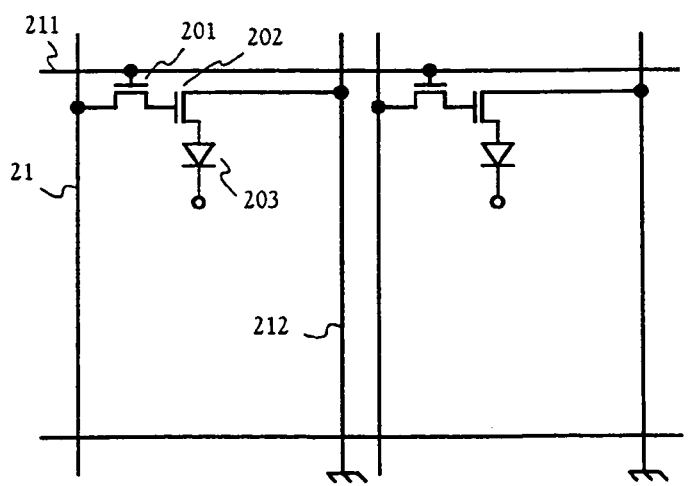

ANISOLE 0.2% (RED) COATING

ELECTRO-OPTICAL DEVICE HAVING AN EL LAYER OVER A PLURALITY OF PIXELS

BACKGROUND OF THE INVENTION

1. Field of the Invention

The present invention relates to an electro-optical device typified by an EL (electroluminescence) display device formed by fabricating semiconductor elements (elements using a semiconductor thin film) on a surface of a substrate, and an electronic device including the electro-optical device as a display. Particularly, the invention relates to a method of manufacturing the same.

2. Description of the Related Art

In recent years, a technique for forming a thin film transistor (hereinafter referred to as a "TFT") on a substrate has made remarkable progress, and its application and development to an active matrix type display device has proceeded. Especially, since a TFT using a semiconductor film that has a crystal structure (e.g., a polysilicon film) has a field effect mobility higher than a conventional TFT using an amorphous silicon film, a high speed operation can be made. Thus, it becomes possible to form a driving circuit that is connected to a pixel portion from the TFT, and to form the driving circuit on the same substrate.

Attention has been paid to such an active matrix type display device since various merits, such as reduction of manufacturing cost, miniaturization and thinning of a display device, increase of yield, and increase of throughput, can be obtained by forming various circuits and elements on the same substrate.

In the active matrix type EL display device, a switching element made of a TFT is provided for each pixel, and a driving element for making current control is operated by the switching element, so that an EL layer (light emitting layer) is made to emit light. For example, there is an EL display device disclosed in U.S. Pat. No. 5,684,365 (see Japanese Patent Application Laid-open No. Hei 8-234683), or Japanese Patent Application Laid-open Publication No. Hei 10-189252.

In methods of color display by these EL display devices, there have been trials of arranging EL layers which emit light of the three primary colors red (R), green (G), and blue (B) in each pixel. However, nearly all of the materials generally used as EL layers are organic materials, and it is difficult to apply a photolithography technique used in micro-machining as is. The reason is that the EL materials themselves are extremely weak with respect to moisture, and their handling is difficult in that they will easily dissolve in even a developer solution.

A technique of forming the EL layers by an ink-jet method has been proposed as a technique of solving these types of problems. For example, in Japanese Patent Application Laid-open No. Hei 10-012377 an active matrix type EL display in which the EL layer is formed by the ink-jet method is disclosed. Further, a similar technique is also disclosed in Shimada, T., et al., "Multicolor Pixel Patterning of Light-Emitting Polymers by Ink-jet Printing," SID 99 DIGEST, pp. 376-379.

It becomes possible to form an EL layer for each single pixel with the ink-jet method, and a process of patterning after forming the EL layer can be omitted. However, for both an active matrix type EL display device and for a passive type EL display device, as the screen size becomes larger and the pixel density increases, requirements for high positional precision and high speed processing increase.

SUMMARY OF THE INVENTION

The present invention aims to simplify the formation of an EL layer by an ink-jet method, and to perform high speed processing. An object of the present invention is to provide a method of manufacturing a high operation performance, high reliability electro-optical device, in particular a method of manufacturing an EL display device. In addition, an object of the present invention is to increase the quality of an electronic device having the EL display device as a display by increasing the picture quality of the electro-optical device.

In order to achieve the above objects, an EL layer is formed so as to be continuous over a plurality of pixels when the EL layer is formed by the ink-jet method. Specifically, the EL layers are formed continuously in a stripe pattern corresponding to a certain selected row or a column of pixel electrodes arranged in an m-column by n-row matrix state. Alternatively, an oblong shape or a rectangular shape EL layer is formed for each pixel electrode.

A predetermined pattern is formed with the ink jet method by repeatedly performing positional control of an ink head and discharge of ink (when an EL layer is formed, a liquid containing the EL layer material). Note that if the screen size becomes large or the pixel density becomes high, then the amount of processing time by this method for forming the EL layers corresponding to each pixel electrode becomes enormous. However, with the above method of forming the stripe state or the oblong or rectangular shapes, it becomes possible to form the EL layers by continuously scanning the ink head and the amount of processing time can be shortened.

In manufacturing a color display EL display device, EL layers corresponding to each or the colors red, green, and blue may be formed so as to form stripes, or in an oblong shape or a rectangular shape. This type of EL layer and EL layer manufacturing method can be applied to an active matrix type display and to a passive matrix type display.

In addition, the diffusion of alkali metals from EL elements formed by the ink-jet method is prevented by an insulating film (passivation film) formed between the EL elements and TFTs with the present invention. Specifically, an insulating film for preventing transmission of alkali metals is formed on a leveling film covering the TFTs. In other words, a material may be used in which the diffusion speed of alkali metals throughout the insulating film at the operation temperature of the EL display device is sufficiently low.

Preferably, an insulating film through which moisture and alkali metals are not transmitted and having a high thermal conductivity (high heat radiating effect) is selected, and the insulating film is formed contacting the EL elements, or more preferably that type of insulating film has a state in which it surrounds the EL elements. Namely, the insulating film having a blocking effect against moisture and alkali metals, and having a heat radiating effect, is formed in a location as close as possible to the EL elements, and deterioration of the EL elements is suppressed by the insulating film.

Further, when a single layer cannot be used as that type of insulating film, an insulating film having a blocking effect against moisture and alkali metals, and an insulating film having a heat radiating effect can be laminated and used. In addition, an insulating film having a blocking effect against moisture, an insulating film having a blocking effect against alkali metals, and an insulating film having a heat radiating effect can also be laminated and used.

BRIEF DESCRIPTION OF THE DRAWINGS

FIGS. 6A and 6B are diagrams showing the top structure and the configuration, respectively, of a pixel portion of an EL display device of the present invention;

DETAILED DESCRIPTION OF THE PREFERRED EMBODIMENTS

Embodiment Mode 1

Figure 1A:
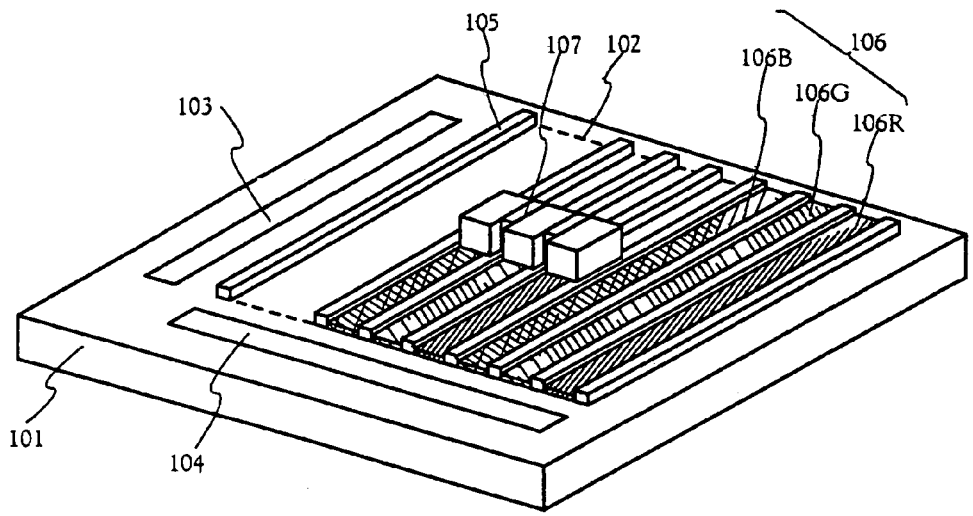
FIGS. 1A to 1C are diagrams for explaining the concept of continuously forming EL layers by an ink-jet method according to the present invention.
Figure 1B:
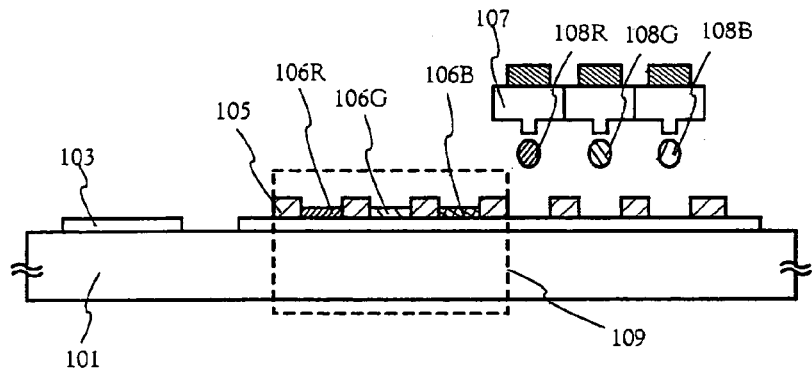
Figure 1C:
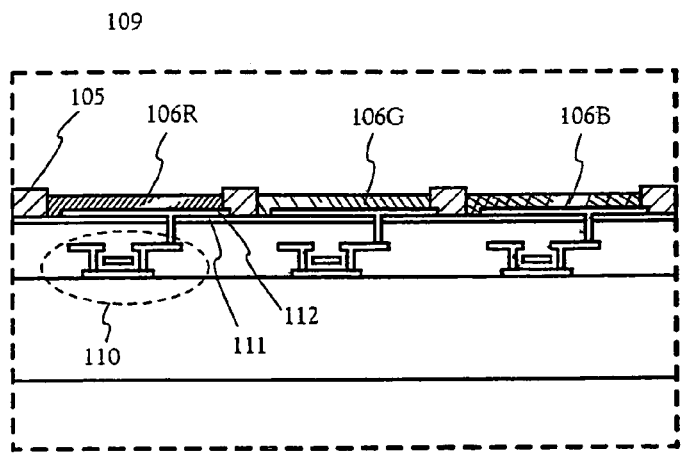

FIGS. 1A to 1C are diagrams for explaining the concept of the present invention. FIG. 1A shows a structure in which a pixel portion 102, a scanning line side driver circuit 103, and a data line side driver circuit 104 are formed on a substrate 101. Separation layers 105 are formed so as to form stripes in the pixel portion 102, and EL layers are formed between each separation layer. The separation layers 105 are formed in order that adjacent EL layers do not mutually mix when forming the EL layers by an ink-jet method.

EL layers 106 are formed by discharging a liquid containing an EL material from an ink head 107. There are no particular limitations on EL layer materials, but to perform color display EL layers 106R, 106G, and 106B may be formed corresponding to red, green, and blue, respectively.

Figure 2A:
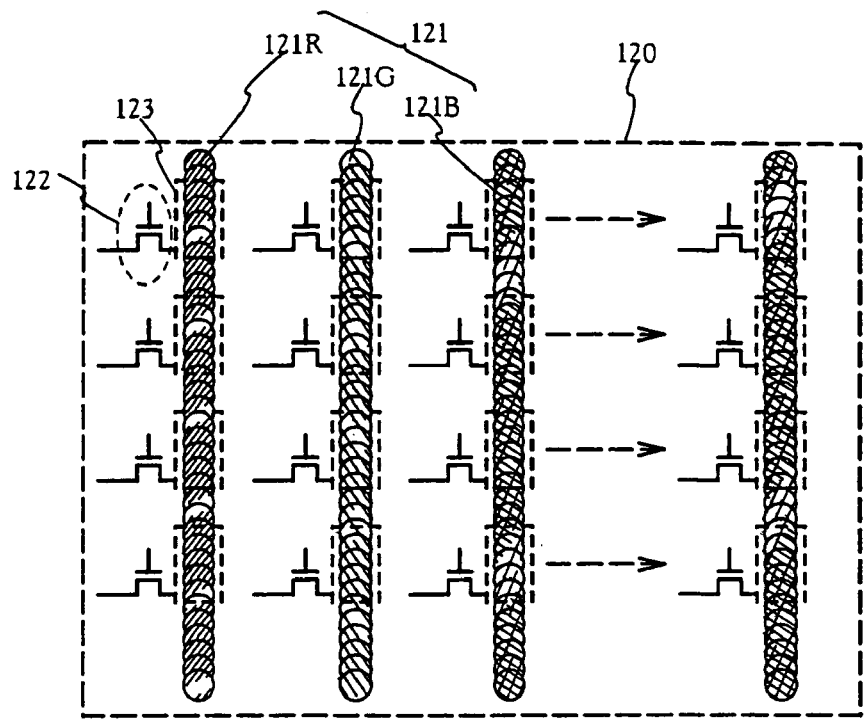
FIGS. 2A and 2B are diagrams for explaining the concept of forming EL layers so as to form stripes or continuously forming the EL layers with respect to pixel electrodes arranged in a matrix state of the present invention.
Figure 2B:
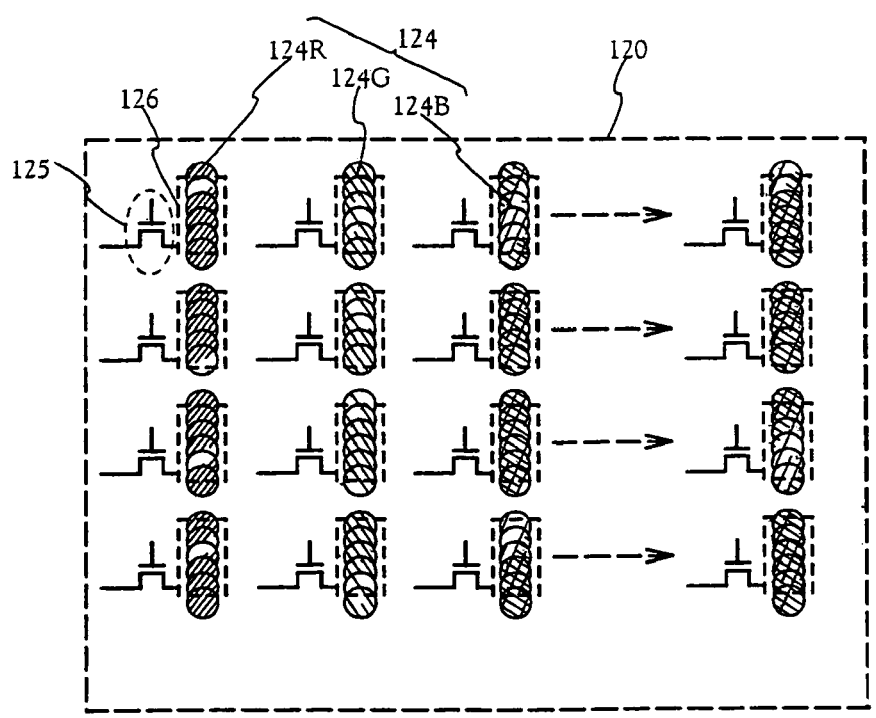

FIGS. 2A and 2B are diagrams for explaining details of the formation of the EL layers in the pixel portion. In FIG. 2A, a plurality of current control TFTs 122 and a plurality of pixel electrodes 123 for connecting to the current control TFTs are formed, corresponding to each pixel, and arranged in a matrix state in the pixel portion 120, and the state of an EL layer 121 formed so as to form stripes corresponding to a selected row or column of the pixel electrodes is shown. EL layers 121R, 121G, and 121B corresponding to red, green, and blue, respectively, may be formed as shown in the figure for performing color display.

Further, EL layers 124 may also be formed to have an oblong shape or a rectangular shape corresponding to current control TFTs 125 arranged in a matrix state in a pixel portion 120 and pixel electrodes 126 connected to the current control TFTs 125. To perform color display, EL layers 124R, 124G, and 124B are similarly formed as shown in the figure.

FIG. 1B is a cross sectional diagram of the schematic diagram shown by FIG. 1A, and shows the state in which the scanning line side driver circuit 103 and the pixel portion 102 are formed on the substrate 101. The separation layers 105 are formed in the pixel portion 102, and the EL layers 106R, 106G, and 106B are formed between each separation layer. The ink head 107 is part of the ink-jet method, and ink dots 108R, 108G, and 108B corresponding to the colors red, green, and blue, respectively, are discharged corresponding to a control signal. The discharged ink dots 108R, 108G, and 108B adhere to the substrate, and function as EL layers after later being dried or fired. As shown in FIGS. 2A and 2B, the present invention is characterized in that the ink dots are formed having a continuous stripe shape, or an oblong or a rectangular shape on the substrate. The ink head may be scanned in one direction for every row or column, and therefore the processing time for forming the EL layers can be reduced.

FIG. 1C is a diagram for explaining the pixel portion in additional detail, and current control TFTs 110 and pixel electrodes 112 connected to the current control TFTs 110 are formed on the substrate, and the EL layers 106R, 106G, and 106B are formed between the separation layers 105 on each pixel electrode. It is also preferable to form insulating films 111 having a blocking effect against alkali metals between the pixel electrodes 112 and the current control TFTs 110.

Figures 3A, 3B:
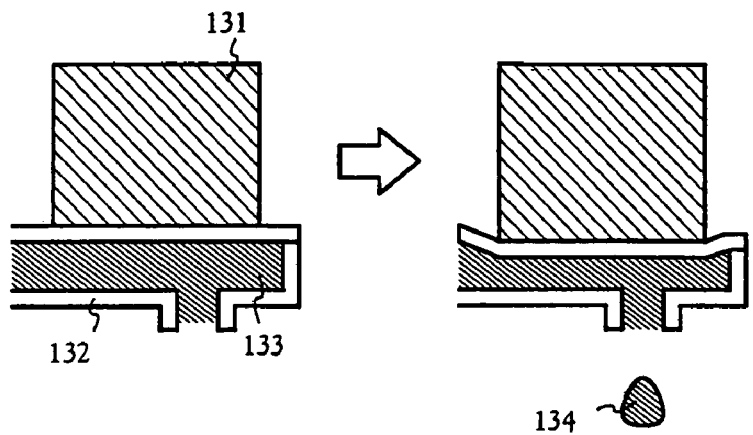
FIGS. 3A and 3B are diagrams for explaining an ink-jet method of the present invention.

FIGS. 3A and 3B are diagrams for explaining the structure of the inkhead, and show an example in which the piezo method is used. Reference numeral 131 designates a piezo element (piezoelectric element); 132, a casing; and 133, an EL forming solution. When a voltage is applied, the piezo element is deformed, and the casing 132 is also deformed. As a result, as shown in FIG. 3B, the EL forming solution 133 inside thereof is ejected as a droplet 134. Like this, by controlling the voltage applied to the piezo element, application of the EL forming solution is carried out. In this case, since the EL forming solution 133 is pushed out by a physical external pressure, its composition etc. is not influenced at all.

Figure 4:
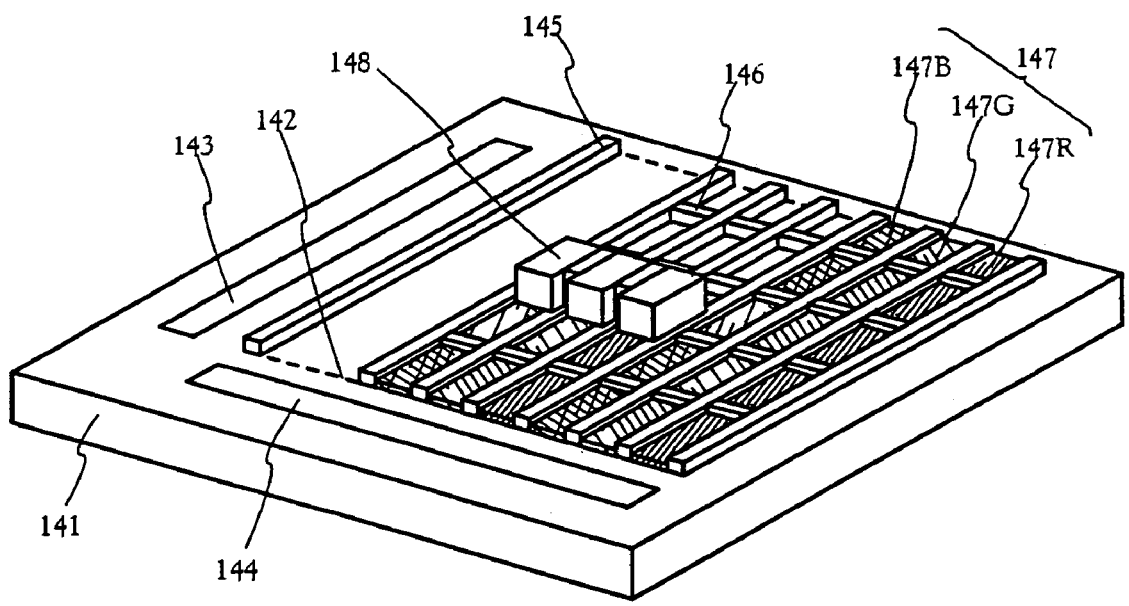
FIG. 4 is a diagram for explaining the concept of continuously forming EL layers by the ink-jet method according to the present invention.

FIG. 4 similarly is a diagram for explaining the concept of the present invention, and first separation layers 145 and second separation layers 146 formed orthogonal to the first separation layers 145 are formed in a pixel portion 142 formed on a substrate 141. EL layers 147 are formed in portions which are surrounded between the first separation layers 146 and the second separation layers 146. The first separation layers 145 and the second separation layers 146 are formed corresponding to each pixel electrode. The EL layers are formed by discharging an EL forming liquid containing an EL material from an ink head 148. EL layers 148R, 148G, and 148B may be formed corresponding to red, green, and blue, respectively, for performing color display.

Embodiment Mode 2

Figure 5:
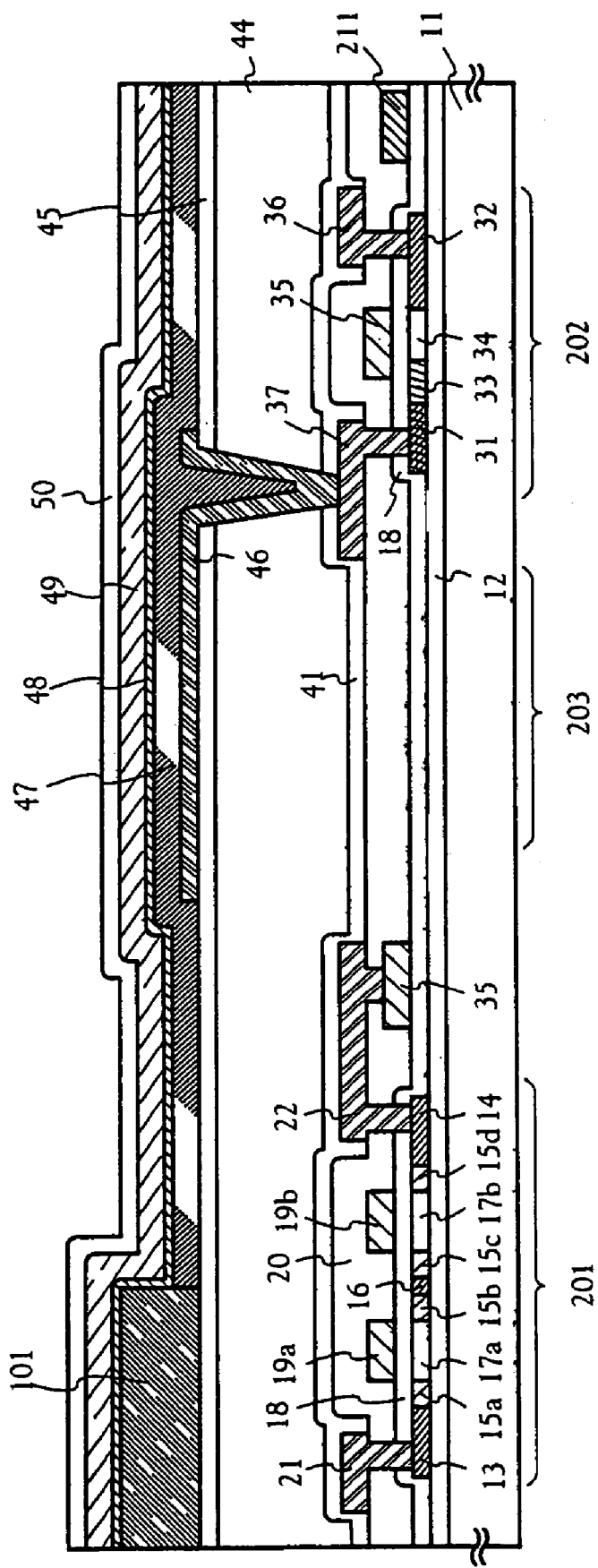
FIG. 5 is a diagram showing the cross sectional structure of the pixel portion of an EL display device of the present invention.

An active matrix type EL display device of the present invention is explained with reference to FIGS. 5, 6A and 6B. Shown in FIG. 5 is a cross sectional diagram of a pixel of the active matrix type EL display device of the present invention, and FIG. 6A is a top view, and FIG. 6B is a circuit structure of the active matrix type EL display device. In practice, a plurality of these types of pixels are arranged in a matrix state, forming a pixel portion (image display portion).

Note that the cross sectional diagram of FIG. 5 shows a cross section cut along the line A-A' in the top view shown in FIG. 6A. Common numerals are used in FIG. 5 and in FIGS. 6A and 6B, and therefore the three figures may be referenced as appropriate.

In FIG. 5, reference numeral 11 denotes a substrate, and reference numeral 12 denotes an insulating film serving as a base film. A glass substrate, a glass ceramic substrate, a quartz substrate, a silicon substrate, a ceramic substrate, a metallic substrate, or a plastic substrate (including a plastic film) can be used as the substrate 11.

Further, the base film 12 is especially effective for cases in which a substrate containing mobile ions, or a substrate having conductivity, is used, but need not be formed for a quartz substrate. An insulating film containing silicon may be formed as the base film 12. Note that the term "insulating film containing silicon" indicates, specifically, an insulating film such as a silicon oxide film, a silicon nitride film, or a silicon nitride oxide film (denoted by SiOxNy) containing silicon, oxygen, and nitrogen in predetermined ratios.

Further, by making the base film 12 possess a heat radiating effect, it is also effective in preventing degradation of the TFTs and deterioration of EL elements due to the emission of heat generated by the TFTs. In this case, an alloy material containing Al, such as an aluminum (Al) oxide or nitride, may also be formed.

Two TFTs are formed inside the pixels. Reference numeral 201 denotes a TFT functioning as a switching element (hereafter referred to as a switching TFT), and reference numeral 202 denotes a TFT functioning as an current control element for controlling the amount of current flowing to the EL elements (hereafter referred to as a current control TFT). Both are formed from n-channel TFTs.

Note that it is not necessary to limit the switching TFT and the current control TFT to n-channel TFTs, and that it is possible to use p-channel TFTs for either the switching TFT or the current control TFT, or for both. In any cases, selection of TFT type is made based on polarity of bias voltage applied to the EL element that is connected to the current control TFT.

The switching TFT 201 is formed having: an active layer containing a source region 13, a drain region 14, LDD regions 15a to 15d, a high concentration impurity region 16, and channel forming regions 17a and 17b; a gate insulating film 18; gate electrodes 19a and 19b, a first interlayer insulating film 20, a source wiring 21, and a drain wiring 22.

Though not shown, the gate electrodes 19a and 19b may be a double gate structure electrically connected by a gate wiring which is formed from a different material (a material having a lower resistance than the gate electrodes 19a and 19b). With this configuration, the device can deal with enlarged display size. Of course, not only a double gate structure, but a so-called multi-gate structure (a structure containing an active layer having two or more channel forming regions connected in series), such as a triple gate structure, may also be used. The multi-gate structure is extremely effective in lowering the value of the off current, and by making the switching element 201 of the pixel into a multi-gate structure with the present invention, a low off current value can be realized for the switching element.

The active layer is formed from a semiconductor film containing a crystal structure. In other words, a single crystal semiconductor film may be used, and a polycrystalline semiconductor film or a microcrystalline semiconductor film may also be used. Further, the gate insulating film 18 may be formed from an insulating film containing silicon. Additionally, known wiring materials represented by Al, tantalum (Ta), tungsten (w), and the like can be used for the gate electrodes, the source wiring, and the drain wiring.

In addition, the LDD regions 15a to 15d in the switching TFT 201 are formed sandwiching the gate insulating film 18, and so as not to overlay with the gate electrodes 17a and 17b. This structure is extremely effective in reducing the off current value.

Note that the formation of an offset region (a region having the same composition as the channel forming regions, and to which a gate voltage is not applied) between the channel forming regions and the LDD regions is more preferable for reducing the off current value. Further, when a multi-gate structure having two or more gate electrodes is used, the high concentration impurity region formed between the channel forming regions is effective in lowering the value of the off current.

By thus using the multi-gate structure TFT as the switching element 201, as above, a switching element having a sufficiently low off current value is realized by the present invention. The gate voltage of the current control TFT can therefore be maintained for a sufficient amount of time (for a period from one selection until the next selection) without forming a capacitor, such as the one illustrated in FIG. 2 in Japanese Patent Application Laid-open No. Hei 10-189252.

Namely, it becomes possible to eliminate the capacitor which has conventionally been a causes of reduction in effective luminescence surface area, and it becomes possible to increase the effective luminescence surface area. This means that the image quality of the EL display device can be made brighter.

The current control TFT 202 is formed having an active layer containing: a source region 31, a drain region 32, an LDD region 33, and a channel forming region 34; a gate insulating film 18; a gate electrode 35; a first interlayer insulating film 20; a source wiring 36; and a drain wiring 37. Note that the gate electrode 35 has a single gate structure, but may also have a multi-gate structure.

As shown in FIGS. 6A and 6B, the drain of the switching TFT is electrically connected to the gate of the current control TFT. Specifically, the gate electrode 35 of the current control TFT 202 is electrically connected to the drain region 14 of the switching TFT 201 through the drain wiring (also referred to as a connection wiring) 22. Further, the source wiring 36 is connected to an current supply wiring 212.

Figure 12:
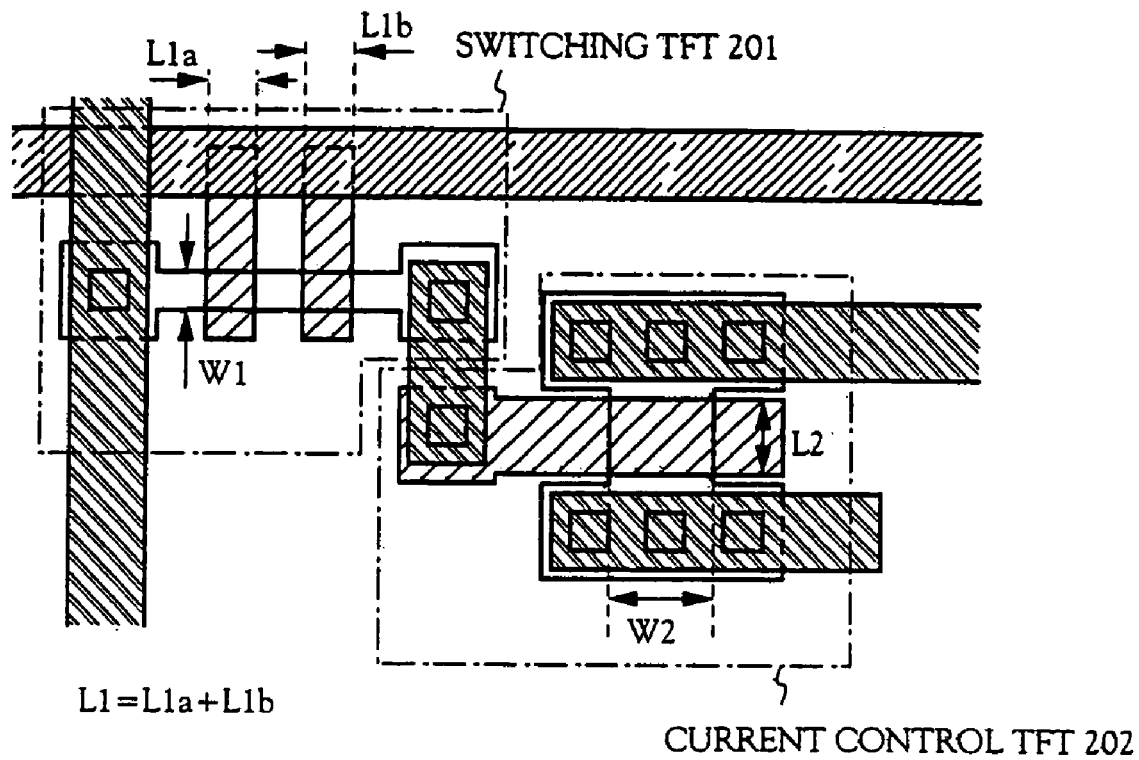
FIG. 12 is an enlarged diagram of the pixel portion of an EL display device of the present invention.

A characteristic of the current control TFT 202 is that its channel width is larger than the channel width of the switching TFT 201. Namely, as shown in FIG. 12, when the channel length of the switching TFT is taken as L1 and its channel width as W1, and the channel length of the current control TFT is taken as L2 and its channel width as W2, a relational expression is reached in which W2/L2≧5×W1/L1 (preferably W2/L4≧10×W1/L1). Consequently, it is possible for more current to easily flow in the current control TFT than in the switching TFT.

Note that the channel length L1 of the multi-gate structure switching TFT 201 is the sum of each of the channel lengths of the two or more channel forming regions formed. A double gate structure is formed in the case of FIG. 12, and therefore the sum of the channel lengths L1*a* and L1*b*, respectively, of the two channel-forming regions becomes the channel length L1 of the switching TFT 201.

The channel lengths L1 and L2, and the channel widths W1 and W2 are not specifically limited to a range of values with the present invention, but it is preferable that W1 be from 0.1 to 5 μm (typically between 1 and 3 μm), and that W2 be from 0.5 to 30 μm (typically between 2 and 10 μm). It is preferable that L1 be from 0.2 to 18 μm (typically between 2 and 15 μm), and that L2 be from 0.1 to 50 μm (typically between 1 and 20 μm) at this time.

Note that it is preferable to set the channel length L somewhat long in order to prevent excess current from flowing in the current control TFT 202. It may preferably be set such that W2/L2≧3 (more preferably W2/L2≧5). It is preferable that the amount of current flow per pixel is from 0.5 to 2 μA (more preferably, from 1 to 1.5 μA).

By setting the numerical values within this range, all standards, from an EL display device having a VGA class number of pixels (640×480) to an EL display device having a high vision class number of pixels (1920×1080) can be included. Furthermore, the length (width) of the LDD region formed in the switching TFT 201 is set from 0.5 to 3.5 μm, typically between 2.0 and 2.5 μm.

Further, the EL display device shown in FIG. 5 is characterized in that, in the current control TFT 202, the LDD region 33 is formed between the drain region 32 and the channel forming region 34, and in that the LDD region 33 has a region which overlaps the gate electrode 35 through the gate insulating film 18, and a region which does not overlap the gate insulating film 18.

The current control TFT 202, at the same time as supplying current for emitting light from an EL element 204, is capable of controlling the amount of current supplied, performing gradation display. Therefore, it is necessary to devise a countermeasure against deterioration due to hot carrier injection so that the TFT does not degrade even if a large current flows. Furthermore, the current control TFT 202 is set to an off state when displaying the color black, and if the value of the off current is high at that time, then the color black cannot be displayed clearly, leading to lowered contrast. It is therefore also necessary to control the value of the off current.

Regarding deterioration due to hot carrier injection, it is known that a structure in which the LDD region overlaps the gate electrode is extremely effective. However, if the entire LDD region is made to overlap with the gate electrode, then the value of the off current increases, and therefore the applicant of the present invention resolved the hot carrier countermeasure and the off current value countermeasure at the same time by a novel structure in which an LDD region is formed in series and does not overlap the gate electrode.

The length of the LDD region which overlaps the gate electrode may be set from 0.1 to 3 μm (preferably between 0.3 and 1.5 μm) at this point. Too long and the parasitic capacity will become large; too short and the hot carrier prevention effect will become weak. Further, the length of the LDD region which does not overlap the gate electrode may be set from 1.0 to 3.5 μm (preferably between 1.5 and 2.0 μm). If it is too long, then sufficient current cannot flow, while if it is too short, then the effect of reducing the value of the off current will weaken.

Further, a parasitic capacitance is formed in the region in which the gate electrode and the LDD region overlap in the above structure, and therefore it is preferable to form this between the source region 31 and the channel forming region 34. The current control TFT always has the identical carrier (electron here) flow direction, and therefore it is sufficient to form the LDD region in only the drain region side.

Furthermore, from the viewpoint of increasing the amount of current that is able to flow, it is effective to make the film thickness of the active layer (in particular, the channel forming region) of the current control TFT 202 thicker (preferably from 50 to 100 nm, even better from 60 to 80 nm). On the other hand, for the case of the switching TFT 201, seen from the point of view of making the value of the off current smaller, it is also effective to make the film thickness of the active layer (in particular, the channel forming region) thinner (preferably from 20 to 50 nm, even better between 25 and 40 nm).

The film thickness of a first passivation film 41 may be set from 10 nm to 1 μm (preferably between 200 and 500 nm). An insulating film containing silicon (in particular, a silicon nitride oxide film or a silicon nitride film is preferable) can be used as the material of the first passivation film 41. The first passivation film 41 possesses a role of protecting the formed TFT from alkali metals and from moisture. Alkali metals such as sodium are contained in the EL layer to be formed later above the TFT. In other words, the first passivation film 41 works as a protecting layer so that alkali metals (mobile ions) do not ingress upon the TFT side.

Further, by making the first passivation film 41 possess a heat radiating effect, it is effective in preventing thermal degradation of the EL layer. Note that in order for light to be emitted from the substrate 11 side in an EL display device with the structure of FIG. 5, it is necessary for the first passivation film 41 to have light transmitting characteristics. In addition, when using an organic material as the EL layer, there is deterioration due to bonding with oxygen, and therefore it is preferable not to use an insulating film through which oxygen is easily released.

An insulating film containing at least one element selected from the group consisting of B (boron), C (carbon), and N (nitrogen), and containing at least one element selected from the group consisting of Al (aluminum), Si (silicon), and P (phosphorous) can be given as a light transmitting material which prevents transmission of alkali metals and which additionally possesses a heat radiating effect. For example, it is possible to use a nitride compound of aluminum, typically aluminum nitride ($Al_xN_y$), a carbide compound of silicon, typically silicon carbide ($Si_xC_y$), a nitride compound of silicon, typically silicon nitride ($Si_xN_y$), a nitride compound of boron, typically boron nitride ($B_xN_y$), and a phosphide of boron, typically boron phosphide ($B_xP_y$). Further, an oxide of aluminum, typically aluminum oxide ($Al_xO_y$), has superior light transmitting characteristics, and a thermal conductivity of 20 $Wm^{-1}$ $K^{-1}$, and is one of the preferable materials. In addition to the above effects, these materials are also effective in preventing the incursion of moisture.

Other elements can be combined with the above chemical compounds. For example, by adding nitrogen to aluminum oxide, it is also possible to use nitrided aluminum oxide, denoted by $AlN_xO_y$. This material, in addition to a heat radiating effect, is also effective in preventing the incursion of moisture, alkali metals, and the like.

Further, the materials recorded in Japanese Patent Application Laid-open No. Hei 62-90260 can also be used. Namely, an insulating film containing Si, Al, N, O, and M (where M denotes at least one rare earth element, preferably at least one element selected from the group consisting of Ce (cerium), Yb (ytterbium), Sm (samarium), Er (erbium), Y (yttrium), La (lanthanum), Gd (gadolinium), Dy (dysprosium), and Nd (neodymium)) can be used. These materials are also effective in preventing the incursion of moisture, alkali metals and the like, in addition to having a heat radiating effect.

Further, a carbon film containing at least a diamond thin film or an amorphous carbon film (in particular, one having characteristics close to those of diamond, referred to as diamond like carbon) can be used. These have extremely high thermal conductivities and are highly effective as heat radiating layers. Note that if the film thickness becomes thick, then it becomes brownish and the transmittivity is reduced, and therefore it is preferable to use as thin a film thickness as possible (preferably from 5 to 100 nm).

Note that the aim of the first passivation film 41 is to protect the TFTs from alkali metals and moisture, and therefore the material must not lose that effect. Therefore, a thin film made from the above materials which possess the heat radiating effect can be used alone, but it is effective to laminate these thin films with an insulating film which can prevent the transmission of alkali metals and moisture (typically a silicon nitride film ($Si_xN_y$) or a silicon nitride oxide film ($SiO_xN_y$)).

Roughly divided, there are four color display methods for an EL display device: a method of forming three types of EL elements corresponding respectively to R (red), G (green), and B (blue); a method of combining white color light emitting EL elements and color filters; a method of combining blue or blue-green EL elements and fluorescent bodies (fluorescent color changing layers, CCMs); and a method of using a transparent electrode for the cathode (opposing electrode) and overlapping EL elements corresponding to RGB. Only one pixel is shown in FIG. 5, but pixels having the identical structure are formed corresponding respectively to the colors red, green, and blue, and color display can be performed by these pixels. Known materials may be employed for the EL layers of each color of pixel. Note that it is possible to implement the present invention without considering the method of light emission, and all four of the above methods can be used in the present invention.

Furthermore, after forming the first passivation film 41, a second interlayer insulating film (which may also be referred to as a leveling film) 44 is formed having a shape which covers each of the TFTs, performing leveling of steps which arise due to the TFTs. An organic resin film is preferable as the second interlayer insulating film 44, and materials such as polyimide, polyamide, acrylic, and BCB (benzocyclobutene) may be used. An inorganic film may also be used, of course, provided that it is capable of sufficient leveling.

The leveling of the steps due to the TFTs by the second interlayer insulating film 44 is extremely important. The EL layers formed later are extremely thin, and therefore there are cases of cracks and short circuits between anodes and cathodes in portions in which the step exists. It is therefore preferable to perform leveling before forming pixel electrodes in order to be able to form the EL layers on as level a surface as possible.

A second passivation film 45 shoulders a vital role of blocking the diffusion of alkali metals from the EL elements. Its film thickness may be set from 5 nm to 1 μm (typically between 20 and 300 nm). An insulating film which can prevent the transmission of alkali metals is used in the second passivation film 45. The materials used as the first passivation film 41 can also be used as the materials for the second passivation film 45. Further, the second passivation film 45 also functions as a heat radiating layer and releases heat generated by the EL elements so that heat does not accumulate in the EL elements. In addition, when the second interlayer insulating film 44 is an organic resin film, it is weak with respect to heat, and therefore the second passivation film 45 ensures that heat generated by the EL elements does not impart any bad influence to the second interlayer insulating film 44. At the same time as preventing deterioration due to heat, the second passivation film 45 also functions as a protecting layer for ensuring that alkali metals within the EL layers do not diffuse to the TFT side, and moreover, also functions as a protecting layer to ensure that moisture and oxygen from the TFT side do not penetrate to the EL layer side.

As stated above, it is effective to perform leveling of the TFTs by the organic resin film in manufacturing the EL display device, but conventionally there have not been any structures which consider the deterioration of the organic resin film due to heat generated by the EL elements. Formation of the second passivation film 45 solves this problem, and is also a characteristic of the present invention.

A pixel electrode (anode of EL element) 46 is a transparent conductive film, and after opening a contact hole in the second passivation film 45, in the second interlayer insulating film 44, and in the first passivation film 41, the pixel electrode 46 is formed so as to connect to the drain wiring 37 of the current control TFT 202 in the formed contact hole portion.

After forming the pixel electrode 46, a separation layer 101 is formed from an organic resin film on the second passivation film 45. In Embodiment Mode 2, the separation layer 101 is formed by a spin coating method from a photosensitive polyimide film, and a separation layer 101 is formed by patterning. The separation layer 10I has a shape as when forming the EL layers by an ink-jet method, and the EL element formation locations can be demarcated by the placement of the separation layer.

After forming the separation layer 101, an EL layer (preferably an organic material) 47 is formed by an ink-jet method. A single layer structure or a lamination structure can be used for the EL layer 47, and there are many cases of using a lamination structure. Various lamination structures have been proposed in which layers such as a light emitting layer, an electron transporting layer, an electron injecting layer, a hole injecting layer, and a hole transporting layer are combined, and any structure may be used for the present invention. Further, a fluorescent pigment or the like may also be doped into the EL layer.

Any already known EL materials can be used by the present invention. Organic materials are widely known as such materials, and considering the driver voltage, it is preferable to use an organic material. For example, the materials disclosed in the following U.S. Patents and Japanese patent applications can be used as the organic EL material:

U.S. Pat. No. 4,356,429; U.S. Pat. No. 4,539,507; U.S. Pat. No. 4,720,432; U.S. Pat. No. 4,769,292; U.S. Pat. No. 4,885,211; U.S. Pat. No. 4,950,950; U.S. Pat. No. 5,059,861; U.S. Pat. No. 5,047,687; U.S. Pat. No. 5,073,446; U.S. Pat. No. 5,059,862; U.S. Pat. No. 5,061,617; U.S. Pat. No. 5,151,629; U.S. Pat. No. 5,294,869; U.S. Pat. No. 5,294,870; Japanese Patent Application Laid-open No. Hei 10-189525; Japanese Patent Application Laid-open No. Hei 8-241048; and Japanese Patent Application Laid-open No. Hei 8-78159.

Specifically, an organic material such as the one shown by the following general formula can be used as a hole injecting layer.

[Chem 1]

Q is either N or a C—R (carbon chain); M is a metal, a metal oxide compound, or a metal halogen compound; R is hydrogen, an alkyl, an aralkyl, an allyl, or an alkalyl; and T1 and T2 are unsaturated six-membered ring including substituents such as hydrogen, alkyls, or halogens.

Furthermore, an aromatic tertiary amine can be used as an organic material hole transporting layer, preferably including the tetra-allyl-diamine shown by the following general formula.

[Chem 2]

In Chem 2 Are is an allylene group, n is an integer from 1 to 4, and AR, $R_7$, $R_8$, and $R_9$ are each chosen allyl group.

In addition, a metal oxynoid compound can be used as an organic material EL layer, electron transporting layer, or electron injecting layer. A material such as that shown by the general formula below may be used as the metal oxynoid compound.

[Chem 3]

It is possible to substitute $R_2$ through $R_7$, and a metal oxynoid compound such as the following can also be used.

[Chem 4]

In Chem 4, $R_2$ through $R_7$ are defined as stated above; $L_1$ through $L_5$ are carbohydrate groups containing from 1 to 12 carbon elements; and both $L_1$ and $L_2$, or both $L_2$ and $L_3$ are formed from benzo-rings. Further, a metal oxynoid compound such as the following may also be used.

[Chem 5]

It is possible to substitute $R_2$ through $R_6$ here. Coordination compounds having organic ligands are thus included as organic EL materials. Note that the above examples are merely some examples of organic EL materials which can be used as the EL material of the present invention, and that there is absolutely no need to limit the EL material to these.

The present invention uses an ink jet method in forming the EL layer, and hence it is preferable to use a polymer-based material as the EL material. A polymer material such as polyparaphenylene vinylenes (PPVs) type material and polyfluorenes type material can be given as typical polymer-based materials. For colorization, it is preferable to use, for example, a cyano-polyphenylene vinylene in a red luminescing material; a polyphenylene vinylene in a green luminescing material; and a polyphenylene vinylene or a polyalkylphenylene in a blue luminescing material.

Note that the above example is an example of an organic EL material which can be used as the EL material of the present invention, and that it is not necessary to place any limitations on this. All of the materials recorded in Japanese Patent Application Laid-open No. Hei 10-012377 can be cited as organic EL materials which can be used in the ink-jet method.

Note that the ink-jet method is roughly divided into a bubble jet method (also referred to as a thermal ink-jet method) and a piezo method, and that the piezo method is preferable for implementing the present invention.

Further, as shown in Embodiment Mode 1, in practice the shape at the time of applying the EL material on the pixel electrodes may be a strip shape, or an oblong shape or a rectangular shape in which a plurality of dots are continuous. The separation layer 101 functions so that adjacent EL layers do not mutually intermix when the EL layers are formed by the ink-jet method.

To perform color display, a red color light emitting EL layer 47R, a green color light emitting layer 47G, and a blue color light emitting EL layer 47B are formed as shown in FIG. 6A. The EL layers may each be formed in order at this point, and the EL layers corresponding respectively to red, green, and blue may be formed at the same time. Further, a baking (firing) process is necessary in order to remove a solvent contained in the EL forming solution. The baking process may be performed after forming all of the EL layers. Alternatively, it may be performed every time the formation of one EL layer is completed. The EL layer is thus formed to have a thickness of from 50 to 250 nm.

Figure 21A:
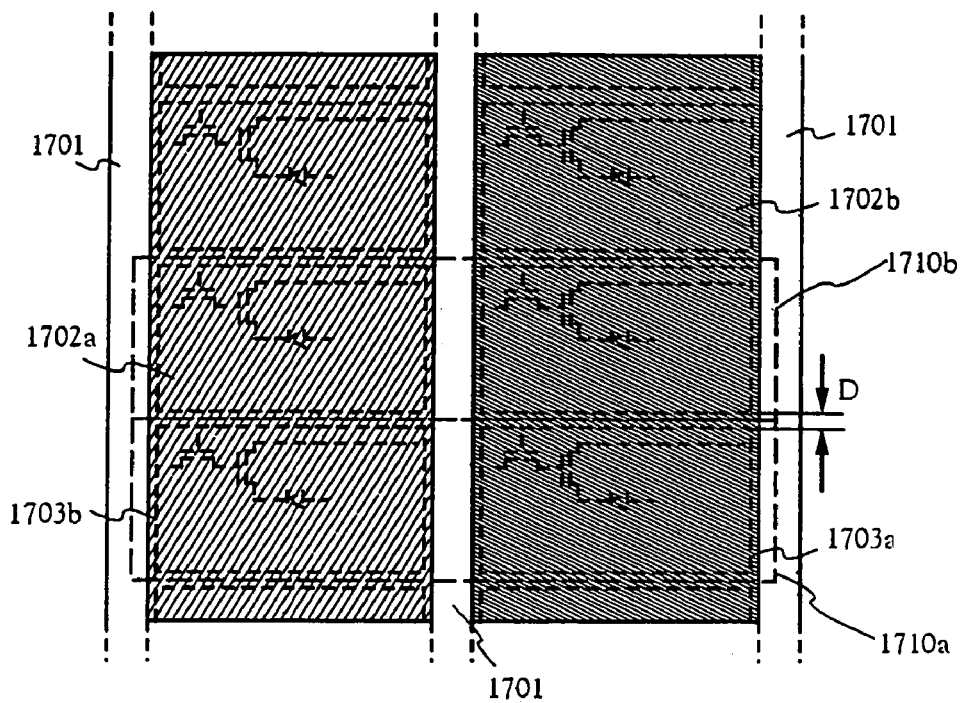
FIGS. 21A and 21B are diagrams for explaining the pixel arrangement of a pixel portion of Embodiment 6.
Figure 21B:
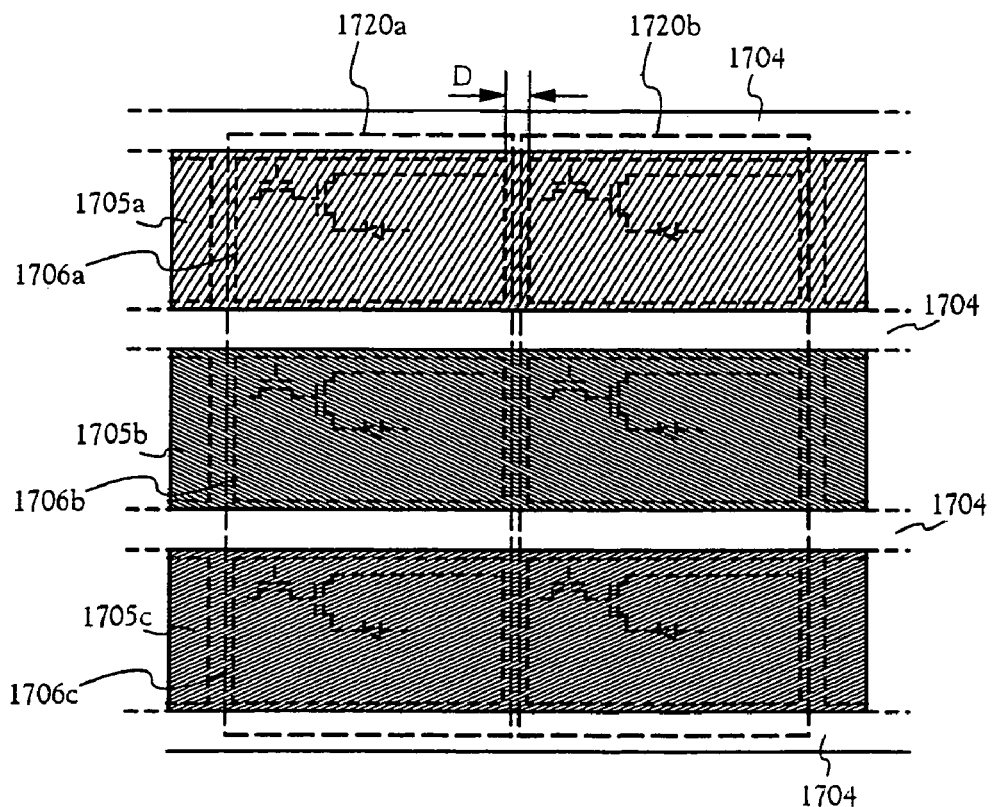

FIGS. 21A and 21B are diagrams for explaining the structure in the pixel portion, and show a state in which a plurality of pixel electrodes are formed in EL layers formed having a stripe shape, or an oblong shape or rectangular shape. A plurality of pixel electrodes are formed corresponding to the different color light emitting EL layers 1702a and 1702b in FIG. 21A. Two TFTs, a switching TFT and an current control TFT, are connected to each of the pixel electrodes. Further, the EL layer 1702a and the EL layer 1702b are separated by a separation layer 1701. For multi-color display, pixel electrodes 1703a and 1703b are taken as one set, forming one pixel 1710a. Similarly, when forming an adjacent pixel 1710b, and taking the gap between the pixels as D, the value of D is set from 5 to 10 times the thickness of the EL layers. Namely, it is set from 250 to 2500 nm.

FIG. 21B is a diagram showing an example of another structure. A plurality of pixel electrodes are formed corresponding to different color light emitting EL layers 1705a, 1705b, and 1705c, for example red, green, and blue. The EL layers are separated by separation layers 1704. For multi-color or RGB full color display, the pixel electrodes 1706a, 1706b, and 1706c are taken as one set, forming one pixel 1720a. An adjacent pixel 1710b is formed similarly, and taking the gap between pixels as D, the value of D is set to be from 5 to 10 times the thickness of the EL layers. Namely, it is set from 250 to 2500 nm. A sharp image display can thus be made.

Further, when forming the EL layer 47, it is preferable to use a dry atmosphere having as little moisture as possible as the processing environment, and it is preferable to performing the formation within an inert gas. The EL layer easily deteriorates due to the existence of moisture and oxygen, and therefore it is necessary to eliminate these causes as much as possible when forming the EL layer 47. For example, atmospheres such as a dry nitrogen atmosphere and a dry argon atmosphere are preferable.

After thus forming the EL layer 47 by the ink-jet method, a cathode 48 and an auxiliary electrode 49 are formed next. A light emitting element formed from the pixel electrode (anode), the EL layer, and the cathode is referred to as an EL element throughout this specification.

A material containing magnesium (Mg), lithium (Li), or calcium (Ca), which have small work coefficients, is used for the cathode 48. Preferably, an electrode made from MgAg (a material in which Mg and Ag are combined at a ratio of Mg:Ag=10:1) is used. An MgAgAl electrode, an LiAl electrode, and an LiFAl electrode can be given as other examples. Further, the auxiliary electrode 49 is an electrode formed in order to be a protecting film from external moisture or the like, and a material containing aluminum (Al) or silver (Ag) is used. The auxiliary electrode 48 also has a heat radiating effect.

Note that it is preferable to form the EL layer 47 and the cathode 48 successively in a dry, inert atmosphere without exposure to the atmosphere. This is in order to avoid the absorption of moisture during exposure to the atmosphere because an organic material, when used as the EL layer, is extremely weak to moisture. In addition, it is even better to form not only the EL layer 47, the cathode 48, but also the auxiliary electrode 49 in succession.

Further, a third passivation film 50 may have a film thickness from 10 nm to 1 μm (preferably between 200 and 500 nm). The aim of forming the third passivation film 50 is mainly for protecting the EL layer 47 from moisture, and it may also be given a heat radiating effect similar to the second passivation film 45. The same materials as those used in the first passivation film 41 can therefore be used as the formation material of the third passivation film 50. Note that when an organic material is used as the EL layer 47, there is the possibility of deterioration due to bonding with oxygen, and therefore it is preferable to use an insulating film through which oxygen is easily radiated.

Further, the EL layer is weak with respect to heat, as stated above, and therefore it is preferable to perform film deposition at as low a temperature as possible (preferably in a temperature range from room temperature to 120° C.). It can therefore be said that plasma CVD, sputtering, vacuum evaporation, ion plating, and solution application (spin coating) are preferable film deposition methods.

Deterioration of the EL element can be sufficiently controlled by forming only the second passivation film 45, but it is more preferable to surround the EL element by sandwiching it using two insulating films, the second passivation film 45 and the third passivation film 50, thus preventing incursion of moisture and oxygen into the EL layer, stopping diffusion of alkali metals from the EL layer, and preventing accumulation of heat in the EL layer. As a result, deterioration of the EL layer is additionally suppressed, and an EL display device having high reliability can be obtained.

Furthermore, the EL display device of the present invention has the pixel portion composed of pixels having the structure shown in FIG. 5, and TFTs having differing structures, corresponding to their function, are arranged within the pixels. A switching TFT having a sufficiently low off current value, and an current control TFT which is strong against hot carrier injection can thus be formed within the same pixel, and an EL display device having high reliability and good image display capabilities (high operation performance) can be obtained.

Note that a multi-gate structure TFT is used as the switching TFT in the pixel structure of FIG. 5, but it is not necessary to limit the structure to that of FIG. 5 with regard to LDD region placement and other structures. A more detailed explanation of the present invention having the above constitution is performed by the embodiments shown below.

Embodiment 1

The embodiments of the present invention are explained using FIGS. 7A to 9C. A method of simultaneous manufacture of a pixel portion, and TFTs of a driver circuit portion formed in the periphery of the pixel portion, is explained here. Note that in order to simplify the explanation, a CMOS circuit is shown as a basic circuit for the driver circuits.

Figure 7A:
FIGS. 7A to 7E are diagrams showing manufacturing processes of an active matrix type EL display device of Embodiment 1.

First, as shown in FIG. 7A, a base film 301 is formed with a 300 nm thickness on a glass substrate 300. Silicon nitride oxide films are laminated as the base film 302 in embodiment 1. It is good to set the nitrogen concentration at between 10 and 25 wt % in the film contacting the glass substrate 300.

Besides, as a part of the base film 301, it is effective to provide an insulating film made of a material similar to the first passivation film 41 shown in FIG. 5. The current controlling TFT is apt to generate heat since a large current is made to flow, and it is effective to provide an insulating film having a heat radiating effect at a place as close as possible.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in embodiment 1 by laser annealing using light from an excimer laser which uses XeCl gas.

Note that pulse emission type excimer laser light formed into a linear shape is used in embodiment 1, but a rectangular shape may also be used, and continuous emission argon laser light and continuous emission excimer laser light can also be used. The light source of laser is not limited to excimer laser, the second harmonic or the third harmonic of YAG laser can be used.

In this embodiment, although the crystalline silicon film is used as the active layer of the TFT, it is also possible to use an amorphous silicon film. However, the current control TFT has necessity of flowing a mass current, it is advantageous to use the crystalline silicon film through which a current can easily flow.

Note that it is effective to form the active layer of the switching TFT, in which there is a necessity to reduce the off current, by the amorphous silicon film, and to form the active layer of the current control TFT by the crystalline silicon film. Current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Figure 7B:
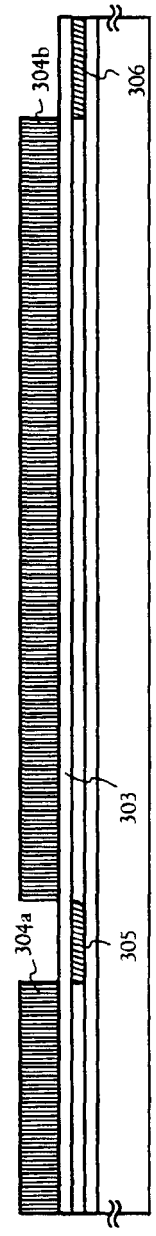

Next, as shown in FIG. 7B, a protecting film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protecting film 303 is formed so that the crystalline silicon film is not directly exposed to plasma during addition of an impurity, and so that it is possible to have delicate concentration control of the impurity.

Resist masks 304a and 304b are then formed on the protecting film 303, and an impurity element which imparts n-type conductivity (hereafter referred to as an n-type impurity element) is added. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1 \times 10^{18}$ atoms/$cm^3$ in embodiment 1. An ion implantation method, in which separation of mass is performed, may also be used, of course.

The dose amount is regulated so that the n-type impurity element is contained in n-type impurity regions 305 and 306, thus formed by this process, at a concentration of $2\times10^{16}$ to $5\times10^{19}$ atoms/cm$^3$ (typically between $5\times10^{17}$ and $5\times10^{18}$ atoms/cm$^3$).

Figure 7C:

Next, as shown in FIG. 7C, the protecting film 303 is removed, and an activation of the added periodic table group 15 elements is performed. A known technique of activation may be used as the means of activation, and activation is done in embodiment 1 by irradiation of excimer laser light. A pulse emission type excimer laser and a continuous emission type excimer laser may both, of course, be used, and it is not necessary to place any limits on the use of excimer laser light. The purpose is the activation of the added impurity element, and it is preferable that irradiation is performed at an energy level at which the crystalline silicon film does not melt. Note that the laser irradiation may also be performed with the protecting film 303 in place. The activation by heat treatment may also be performed along with activation of the impurity element by laser light. When activation is performed by heat treatment, considering the heat resistance of the substrate, it is good to perform heat treatment on the order of 450 to 550° C.

A boundary portion (connecting portion) with regions along the edges of the n-type impurity regions 305 and 306, namely regions along the perimeter into which the n-type impurity element, which exists in the n-type impurity regions 305 and 306, is not added, is delineated by this process. This means that, at the point when the TFTs are later completed, extremely good connections can be formed between LDD regions and channel forming regions.

Figure 7D:
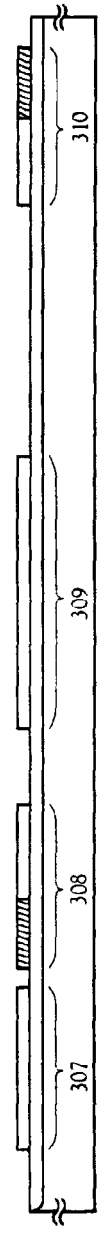

Unnecessary portions of the crystalline silicon film are removed next, as shown in FIG. 7D, and island shape semiconductor films (hereafter referred to as active layers) 307 to 310 are formed.

Figure 7E:
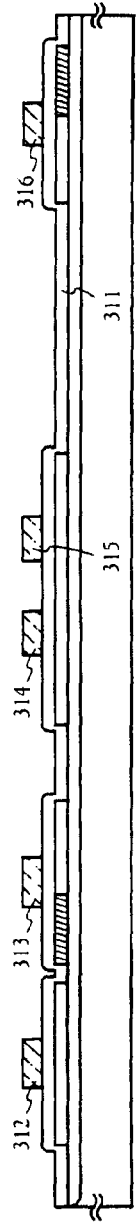

Then, as shown in FIG. 7E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon nitride oxide film is used in embodiment 1.

A conducting film with a thickness of 200 to 400 nm is formed next and patterned, forming gate electrodes 312 to 316. Note that in embodiment 1, the gate electrodes and lead wirings electrically connected to the gate electrodes (hereafter referred to as gate wirings) are formed from different materials. Specifically, a material having a lower resistance than that of the gate electrodes is used for the gate wirings. This is because a material which is capable of being micro-processed is used as the gate electrodes, and even if the gate wirings cannot be micro-processed, the material used for the wirings has low resistance. Of course, the gate electrodes and the gate wirings may also be formed from the same material.

Further, the gate wirings may be formed by a single layer conducting film, and when necessary, it is preferable to use a two layer or a three layer lamination film. All known conducting films can be used as the gate electrode material. However, as stated above, it is preferable to use a material which is capable of being micro-processed, specifically, a material which is capable of being patterned to a line width of 2 μm or less.

Typically, it is possible to use a film made of an element selected from tantalum (Ta), titanium (Ti), molybdenum (Mo), tungsten (W), chromium (Cr), and silicon (Si) which has a conductivity, a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film, titanium silicide film). Of course, the films may be used as a single layer or a laminate layer. In this embodiment, a laminate film of a tantalum nitride (TaN) film having a thickness of 50 nm and a Ta film having a thickness of 350 nm is used. These may be formed by a sputtering method. When an inert gas of Xe, Ne or the like is added as a sputtering gas, film peeling due to stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 8A:
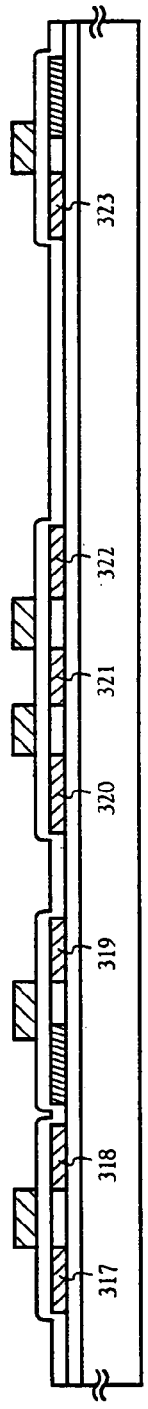
FIGS. 8A to 8D are diagrams showing manufacturing processes of an active matrix type EL display device of Embodiment 1.

Next, an n-type impurity element (phosphorous is used in embodiment 1) is added in a self-aligning manner with the gate electrodes 312 to 316 as masks, as shown in FIG. 8A. The addition is regulated so that phosphorous is added to impurity regions 317 to 323 thus formed at a concentration of 1/10 to 1/2 that of the impurity regions 305 and 306 (typically between 1/4 and 1/3). Specifically, a concentration of $1\times10^{16}$ to $5\times10^{18}$ atoms/cm$^3$ (typically $3\times10^{17}$ to $3\times10^{18}$ atoms/cm$^3$) is preferable.

Figure 8B:
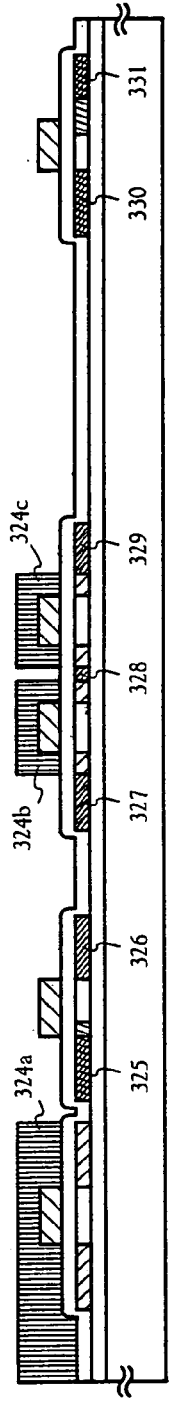

Resist masks 324a to 324c are formed next, with a shape covering the gate electrodes etc, as shown in FIG. 8B, and an n-type impurity element (phosphorous is used in embodiment 1) is added, forming impurity regions 325 to 331 containing a high concentration of phosphorous. Ion doping using phosphine (PH$_3$) is also performed here, and is regulated so that the phosphorous concentration of these regions is from $1\times10^{20}$ to $1\times10^{21}$ atoms/cm$^3$ (typically between $2\times10^{20}$ and $5\times10^{21}$ atoms/cm$^3$).

A source region or a drain region of the n-channel TFT is formed by this process, and in the switching TFT, a portion of the n-type impurity regions 320 to 322 formed by the process of FIG. 8A remains. These remaining regions correspond to the LDD regions 15a to 15d of the switching TFT in FIG. 5.

Figure 8C:
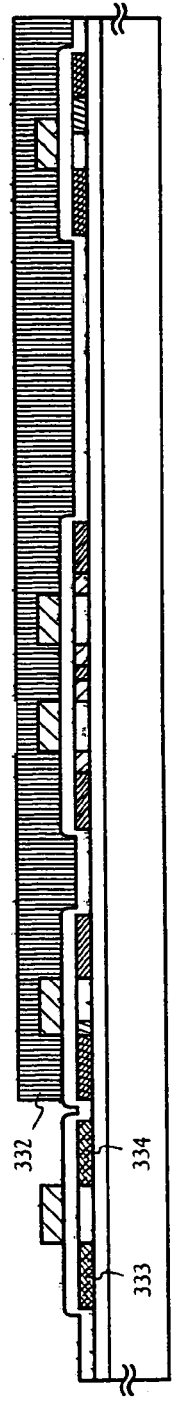

Next, as shown in FIG. 8C, the resist masks 324a to 324c are removed, and a new resist mask 332 is formed. A p-type impurity element (boron is used in embodiment 1) is then added, forming impurity regions 333 and 334 containing a high concentration of boron. Boron is added here to form impurity regions 333 and 334 at a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorous has already been added to the impurity regions 333 and 334 at a concentration of $1\times10^{20}$ to $1\times10^{21}$ atoms/cm$^3$, but boron is added here at a concentration of at least 3 times than of the phosphorous. Therefore, the n-type impurity regions already formed completely invert to p-type, and function as p-type impurity regions.

Next, after removing the resist mask 332, the n-type and p-type impurity elements added at various concentrations are activated. Furnace annealing, laser annealing, or lamp annealing may be performed as a means of activation. Heat treatment is performed in embodiment 1 in a nitrogen atmosphere for 4 hours at 550° C. in an electric furnace.

It is important to remove as much of the oxygen in the atmosphere as possible at this time. This is because if any oxygen exists, then the exposed surface of the electrode oxidizes, inviting an increase in resistance, and at the same time it becomes more difficult to later make an ohmic contact. It is therefore preferable that the concentration of oxygen in the processing environment in the above activation process should be 1 ppm or less, desirably 0.1 ppm or less.

Figure 8D:
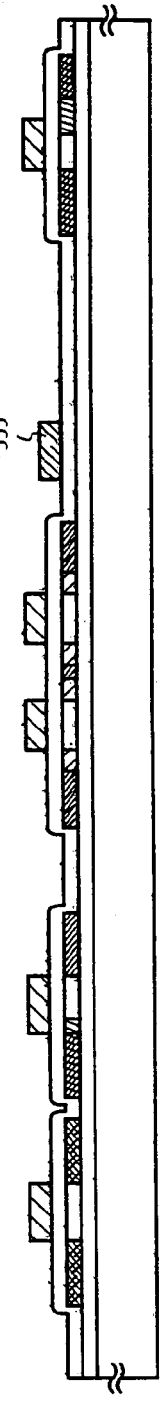

After the activation process is completed, a gate wiring 335 with a thickness of 300 nm is formed next as shown in FIG. 8D. A metallic film having aluminum (Al) or copper (Cu) as its principal constituent (comprising 50 to 100% of the composition) may be used as the material of the gate wiring 335. As with the gate wiring 211 of FIG. 2, the gate wiring 335 is formed with a placement so that the gate electrodes 314 and 315 of the switching TFTs (corresponding to gate electrodes 19a and 19b of FIG. 2) are electrically connected.

The wiring resistance of the gate wiring can be made extremely small by using this type of structure, and therefore a pixel display region (pixel portion) having a large surface area can be formed. Namely, the pixel structure of embodiment 1 is extremely effective because an EL display device having a screen size of a 10 inch diagonal or larger (in addition, a 30 inch or larger diagonal) is realized due to this structure.

Figure 9A:
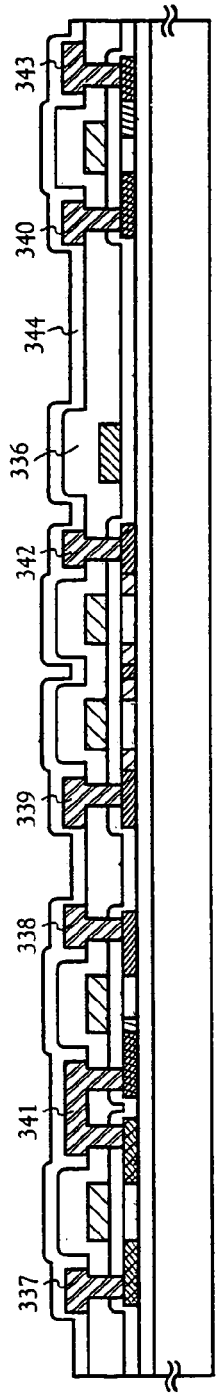
FIGS. 9A to 9C are diagrams showing manufacturing processes of an active matrix type EL display device of Embodiment 1.
Figure 9B:
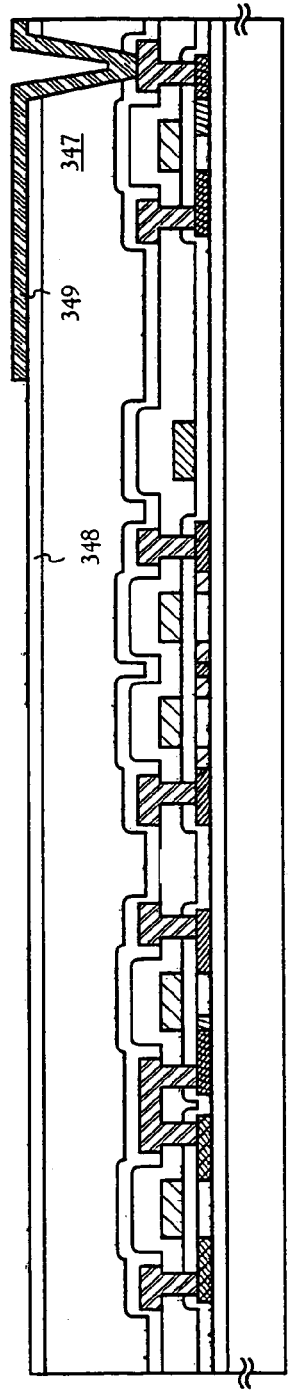

A first interlayer insulating film 336 is formed next, as shown in FIG. 9A. A single layer insulating film containing silicon is used as the first interlayer insulating film 336, while a lamination film may be combined in between. Further, a film thickness of between 400 nm and 1.5 µm may be used. A lamination structure of an 800 nm thick silicon oxide film on a 200 nm thick silicon nitride oxide film is used in embodiment 1.

In addition, heat treatment is performed for 1 to 12 hours at 300 to 450° C. in an environment containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 336. Namely, hydrogen processing may be performed as above after forming the 200 nm thick silicon nitride oxide film, and then the remaining 800 nm thick silicon oxide film may be formed.

Next, a contact hole is formed in the first interlayer insulating film 336, and source wirings 337 to 340 and drain wirings 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 344 is formed next with a thickness of 50 to 500 nm (typically between 200 and 300 nm). A 300 nm thick silicon nitride oxide film is used as the first passivation film 344 in embodiment 1. This may also be substituted by a silicon nitride film. It is of course possible to use the same materials as those of the first passivation film 41 of FIG. 5.

Note that it is effective to perform plasma processing using a gas containing hydrogen such as $H_2$ or $NH_3$ etc. before the formation of the silicon nitride oxide film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Next, a second interlayer insulating film 347 made of organic resin is formed. As the organic resin, it is possible to use polyimide, polyamide, acryl, BCB (benzocyclobutene) or the like. Especially, since the second interlayer insulating film 346 is primarily used for flattening, acryl excellent in flattening properties is preferable. In this embodiment, an acrylic film is formed to a thickness sufficient to flatten a stepped portion formed by TFTs. It is appropriate that the thickness is preferably made 1 to 5 µm (more preferably, 2 to 4 µm).

Next, a second passivation film 348 having a thickness of 100 nm is formed on the second interlayer insulating film 347. In this embodiment, since an insulating film containing Si, Al, N, O and La is used, it is possible to prevent alkaline metal from diffusing from the EL layer provided thereon. At the same time, intrusion of moisture into the EL layer is blocked and heat generated in the EL layer is dissipated, so that it is possible to suppress deterioration of the EL layer due to heat and deterioration of the flattened film (second interlayer insulating film).

A contact hole reaching a drain wiring 343 is formed through the second passivation film 348, the second interlayer insulating film 347, and the first passivation film 344, and a pixel electrode 349 is formed. In this embodiment, an indium-tin oxide (ITO) film having a thickness of 110 nm is formed, and patterning is carried out to form the pixel electrode. This pixel electrode 349 becomes an anode of the EL element. Incidentally, as other materials, it is also possible to use an indium-titanium oxide film or an indium-zinc oxide film.

Incidentally, this embodiment has such a structure that the pixel electrode 349 is electrically connected to the drain region 331 of the current controlling TFT through the drain wiring 343. This structure has merits as follows:

Since the pixel electrode 349 comes in direct contact with an organic material of an EL layer (light emitting layer) or charge transporting layer, there is a possibility that a movable ion contained in the EL layer or the like diffuses in the pixel electrode. That is, in the structure of this embodiment, the pixel electrode 349 is not directly connected to the drain region 331 as a part of the active layer, but the drain wiring 343 is made to intervene so that intrusion of the movable ion into the active layer can be prevented.

Figure 9C:
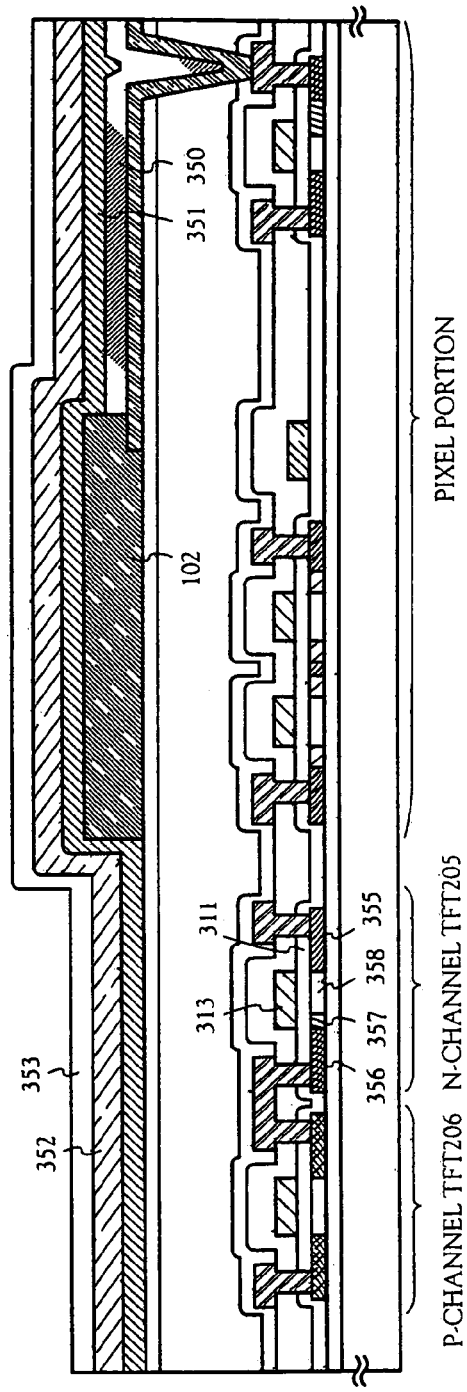

Next, as shown in FIG. 9C, an EL layer 350 is formed by an ink jet method, and further, a cathode (MgAg electrode) 351 and a protecting electrode 352 are formed without opening to the air. At this time, it is desirable to completely remove moisture by carrying out a heat treatment to the pixel electrode 349 before the EL layer 350 and the cathode 351 are formed. In this embodiment, although the MgAg electrode is used as the cathode of the EL element, other well-known materials may be used.

As the EL layer 350, the materials explained in the embodiment mode 2 of the invention can be used. In this embodiment, although a four-layer structure of a hole injecting layer, a hole transporting layer, a light emitting layer and an electron transporting layer are made an EL layer, there is also a case where an electron transporting layer is not formed, where an electron injecting layer is provided, or where a hole injecting layer is omitted. Like this, various examples have already been reported for the combination, and any structure of them may be used.

An amine such as TPD (triphenylamine dielectric) may be used as the hole injecting layer or as the hole transporting layer, and in addition, a hydrazone (typically DEH), a stilbene (typically STB), or a starburst (typically m-MTDATA) can also be used. In particular, a starburst material, which has a high glass transition temperature and is difficult to crystallize, is preferable.

BPPC, perylene, and DCM can be used as a red color emitting layer in the emitting layer, and in particular, the Eu complex shown by $Eu(DBM)_3(Phen)$ (refer to Kido, J., et. al, Appl. Phys., vol. 35, pp. L394-396, 1996 for details) is highly monochromatic, possessing a sharp emission at a wavelength of 620 nm.

Further, typically an Alq$_3$ (8-hydroxyquinoline aluminum) material in which quinacridone or coumarin is added at a level of several mol % can be used as a green color emitting layer.

[Chem 6]

In addition, typically a distile-arylene amino dielectric, in which amino substituted DSA is added to DSA (distile-arylene dielectric) can be used as a blue color emitting layer. In particular, it is preferable to use the high performance material distilyl-biphenyl (DPVBi). Its chemical formula is as shown below.

[Chem 7]

Although even the auxiliary electrode 352 can protect the EL layer 350 from moisture or oxygen, preferably, a third passivation film 353 may be provided. In this embodiment, as the third passivation film 353, a silicon nitride film having a thickness of 300 nm is provided. This third passivation film may also be formed continuously after the auxiliary electrode 352 without opening to the air. Of course, as the third passivation film 353, the same material as the third passivation film 50 of FIG. 5 may be used.

Besides, the auxiliary electrode 352 is provided to prevent deterioration of the MgAg electrode 351, and a metal film containing aluminum as its main ingredient is typical. Of course, another material may be used. Since the EL layer 350 and the MgAg electrode 351 are very weak to moisture, it is desirable to make continuous formation to the auxiliary electrode 352 without opening to the air so that the EL layer is protected from the outside air.

Incidentally, it is appropriate that the thickness of the EL layer 350 is made 10 to 400 nm (typically 60 to 160 nm), and the thickness of the MgAg electrode 351 is made 180 to 300 nm (typically 200 to 250 nm). In the case that EL layer 350 is a laminate structure, the film thickness of each layer is the range of 10 to 100 nm.

In this way, an active matrix type EL display device having a structure as shown in FIG. 9C is completed. In the active matrix type EL display device of this embodiment, a TFT having an optimum structure is disposed in not only the pixel portion but also the driving circuit portion, so that very high reliability is obtained and operation characteristics can also be improved.

First, a TFT having a structure to decrease hot carrier injection so as not to drop the operation speed thereof as much as possible is used as an n-channel TFT 205 of a CMOS circuit forming a driving circuit. Incidentally, the driving circuit here includes a shift register, a buffer, a level shifter, a sampling circuit (sample and hold circuit) and the like. In the case where digital driving is made, a signal conversion circuit such as a D/A converter can also be included.

In the case of this embodiment, as shown in FIG. 9C, the active layer of the n-channel 205 includes a source region 355, a drain region 356, an LDD region 357 and a channel formation region 358, and the LDD region 357 overlaps with the gate electrode 313, putting the gate insulating film 311 therebetween.

Consideration not to drop the operation speed is the reason why the LDD region is formed at only the drain region side. In this n-channel TFT 205, it is not necessary to pay attention to an off current value very much, rather, it is better to give importance to an operation speed. Thus, it is desirable that the LDD region 357 is made to completely overlap with the gate electrode to decrease a resistance component to a minimum. That is, it is preferable to remove the so-called offset.

In the p-channel TFT 206 of the CMOS circuit, since deterioration due to hot carrier injection can be almost neglected, an LDD region does not have to be particularly provided. Of course, similarly to the n-channel TFT 205, it is also possible to provide an LDD region to take a countermeasure against hot carriers. Incidentally, a sampling circuit among driving circuits is rather specific as compared with other circuits, and a large current flows through a channel formation region in both directions. That is, the roles of a source region and a drain region are counterchanged. Further, it is necessary to suppress an off current value to the lowest possible value, and in that meaning, it is desirable to dispose a TFT having an approximately intermediate function between the switching TFT and the current controlling TFT.

Figure 13:
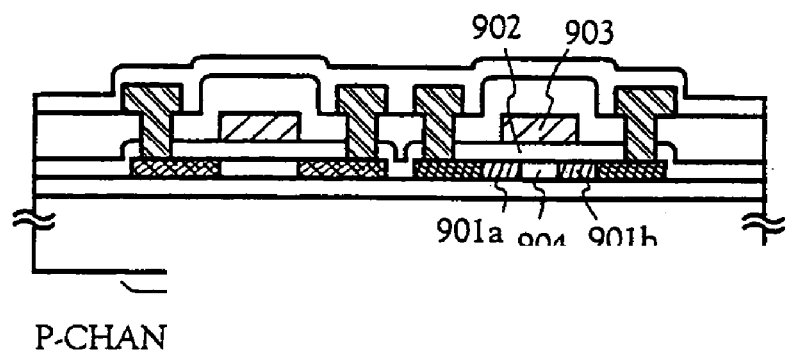
FIG. 13 is a diagram showing the element structure of a sampling circuit of an EL display device of Embodiment 1.

Thus, as an n-channel TFT forming the sampling circuit, it is desirable to dispose a TFT having a structure as shown in FIG. 13. As shown in FIG. 13, parts of LDD regions 901a and 901b overlap with a gate electrode 903, putting a gate insulating film 902 therebetween. This effect is as set forth in the explanation of the current controlling TFT 202, and a different point is that in the sampling circuit, the LDD regions 901a and 901b are provided to be put at both sides of a channel formation region 904.

The pixel portion is formed by forming the pixel structure which is shown in the FIG. 5. The structure of the switching TFT or the current control TFT formed in a pixel is not provided an explanation because it was given in FIG. 5.

Actually, when the state of FIG. 9C is completed, it is preferable to make packaging (sealing) by a housing member such as a protection film having high airtightness and less degassing (laminate film, ultraviolet ray curing resin film, etc.) or a ceramic sealing can so as to prevent exposure to the outer air. At that time, when the inside of the housing member is made an inert gas atmosphere, or a moisture absorbent (for example, barium oxide) is disposed in the inside, the reliability (lifetime) of the EL layer is improved.

After the airtightness is raised by processing such as packaging, a connector (flexible print circuit: FPC) for connecting a terminal extended from the element or circuit formed on the substrate to an external signal terminal is attached so that a product is completed. In the present specification, the EL display device, which is made to have such a state that it can be shipped, is called an EL module.

Here, the structure of the active matrix type EL display device of this embodiment will be described with reference to a perspective view of FIG. 10. The active matrix type EL display device of this embodiment is constituted by a pixel portion 602, a gate side driving circuit 603, and a source side driving circuit 604 formed on a glass substrate 601. A switching TFT 605 of a pixel portion is an n-channel TFT, and is disposed at an intersection point of a gate wiring 606 connected to the gate side driving circuit 603 and a source wiring 607 connected to the source side driving circuit 604. The drain of the switching TFT 605 is connected to the gate of a current controlling TFT 608.

Further, the source of the current controlling TFT 606 is connected to a current supply line 609. In the structure of this embodiment, a current supply line 609 is given an earth electric potential. An EL element 610 is connected to the drain of the current controlling TFT 608. Further, a cathode of the EL element 610 is added a fixed voltage (10 to 12 V in this embodiment). Input-output wirings (connection wirings) 612 and 613 for transmitting signals to the driving circuits and an input-output wiring 614 connected to the current supply line 609 are provided in an FPC 611 as an external input-output terminal.

Figure 10:
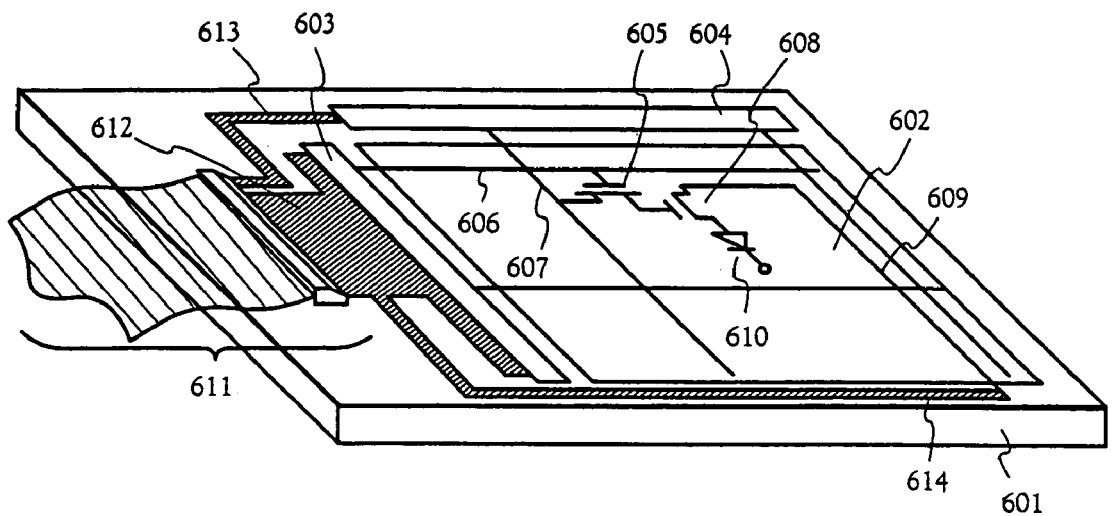
FIG. 10 is a diagram showing an external view of an EL module of Embodiment 1.
Figure 11:
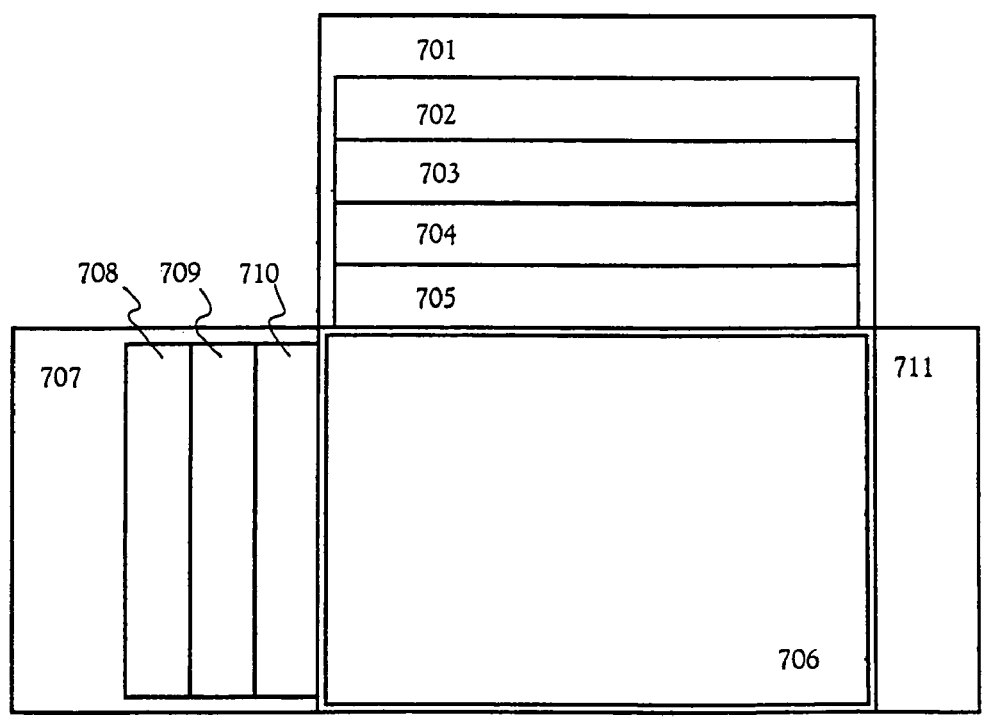
FIG. 11 is a diagram showing the circuit block structure of an EL display device of Embodiment 1.

An example of circuit structure of the EL display device shown in FIG. 10 is shown in FIG. 11. The circuit structure shown in FIG. 11 is an example of an analog driving, a source side driving circuit 701, a gate side driving circuit (A) 707, a gate side driving circuit (B) 711, and a pixel portion 706.

Incidentally, in the present specification, the term "driving circuit" is a general term including the source side driving circuit and the gate side driving circuit.

The source side driving circuit 701 is provided with a shift register 702, a level shifter 703, a buffer 704, and a sampling circuit (sample and hold circuit) 705. The gate side driving circuit (A) 707 is provided with a shift register 708, a level shifter 709, and a buffer 710. The gate side driving circuit (B) 711 also has the same structure.

Here, the shift registers 702 and 708 have driving voltages of 5 to 16 V (typically 10 V) respectively, and the structure indicated by 205 in FIG. 9C is suitable for an n-channel TFT used in a CMOS circuit forming the circuit.

Besides, for each of the level shifters 703 and 709 and the buffers 704 and 710, while the driving voltage is raised 14 to 16 V, similarly to the shift register, the CMOS circuit including the n-channel TFT 205 of FIG. 9C is suitable. Incidentally, it is effective to make a gate wiring a multi-gate structure such as a double gate structure or a triple gate structure in improvement of reliability of each circuit. Besides, since the source region and the drain region are inverted and it is necessary to decrease an off current value, a CMOS circuit including the n-channel TFT 208 of FIG. 13 is suitable for the sampling circuit 705 while its driving voltage is 14 to 16V. The pixel portion 706, which driving voltage is 14 to 16V, are disposed pixels having the structure shown in FIG. 5.

The foregoing structure can be easily realized by manufacturing TFTs in accordance with the manufacturing steps shown in FIGS. 7A to 9C. In this embodiment, although only the structure of the pixel portion and the driving circuit is shown, if the manufacturing steps of this embodiment are used, it is possible to form a logical circuit other than the driving circuit, such as a signal dividing circuit, a D/A converter circuit, an operational amplifier circuit, a γ correction circuit, or the like on the same substrate, and further, it is believed that a memory portion, a microprocessor, or the like can be formed.

Further, an EL module of this embodiment including a housing member as well will be described with reference to FIGS. 14, 15A and 15B. Incidentally, as needed, reference numbers used in FIGS. 10 and 11 will be quoted.

Figure 14:
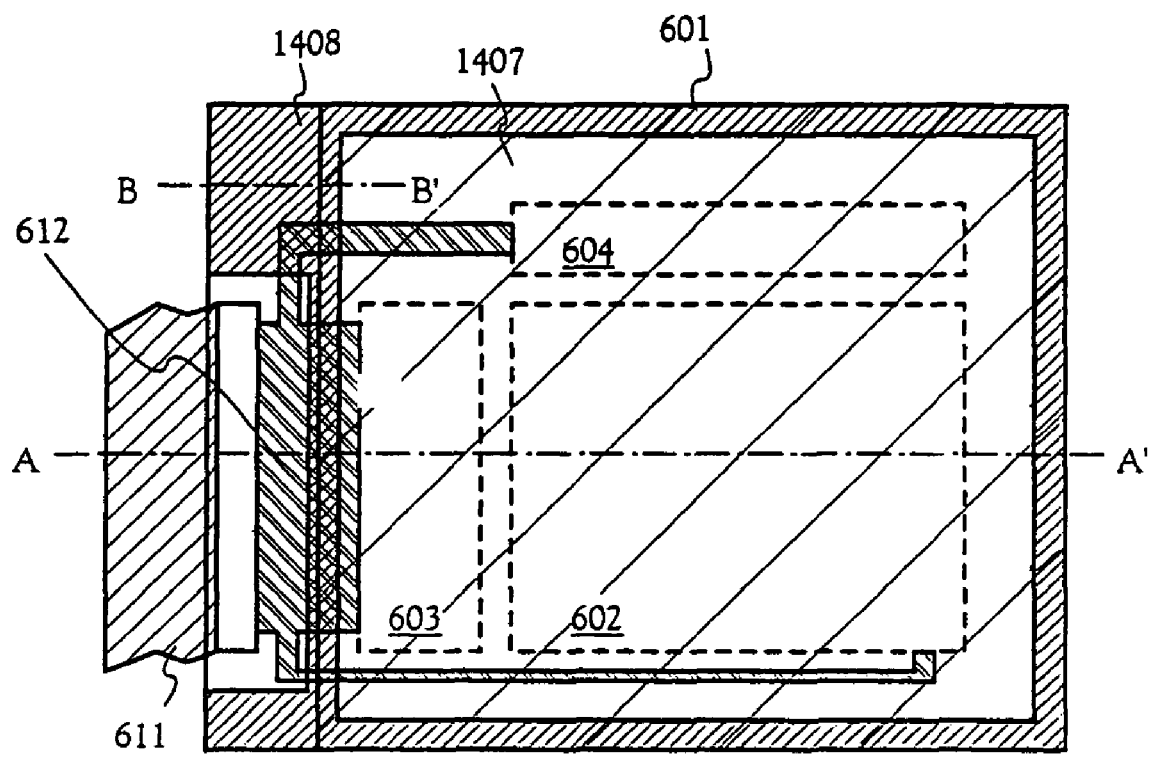
FIG. 14 is a top view showing an EL module of Embodiment 1.

In FIG. 14, reference numeral 601 denotes a substrate, reference numeral 602 denotes a pixel portion, 603 denotes a source side driver circuit, 604 denotes a gate side driver circuit, and 612 denotes connection wirings for electrically connecting the pixel portion 602, the source side driver circuit 603, and the gate side driver circuit 604 to an FPC (flexible printed circuit) 611. Further, the FPC is electrically connected to external equipment, and external signals can thus be input to the pixel portion 602, the source side driver circuit 603, and the gate side driver circuit 604. The pixel portion 602, the source side driver circuit 603, and the gate side driver circuit 604 are formed from thin film transistors (hereafter referred to as TFTs) formed on the substrate 601. Note that TFTs having any type of structure may be used as the TFTs. Known structures may also be used, of course. In addition, a filler material (not shown in the figure), a covering material 1407, a sealing material (not shown in the figure), and a frame material 1408 are formed.

Figure 15A:
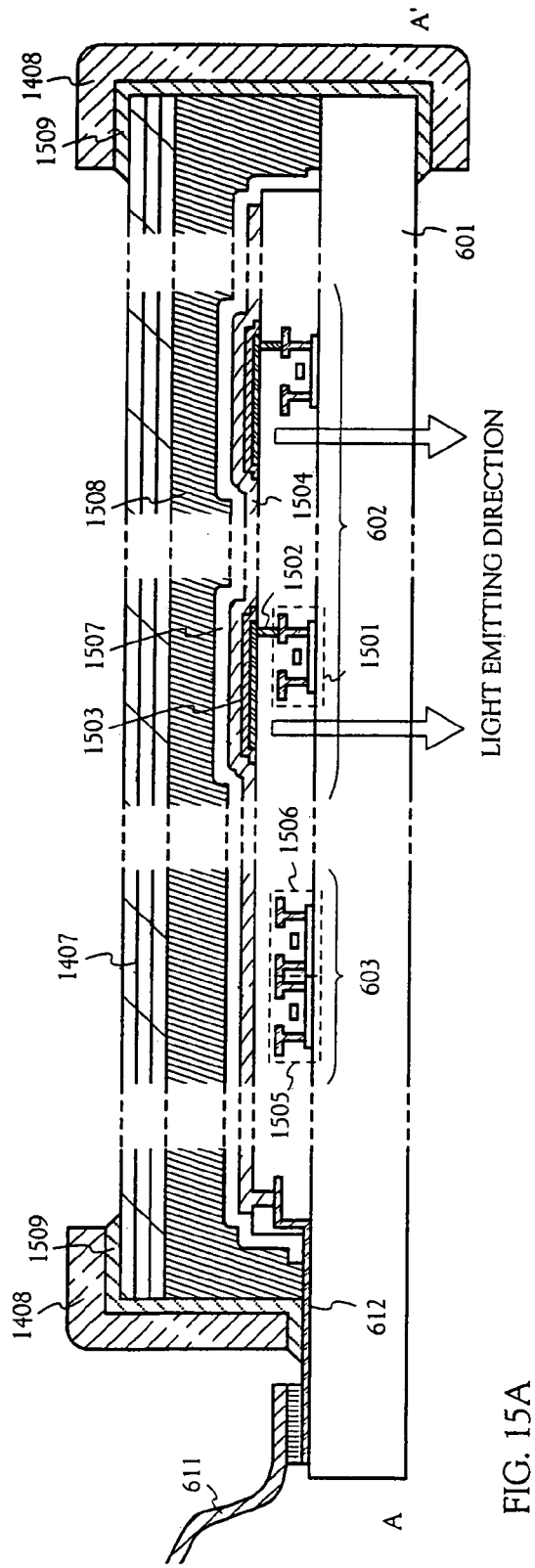
FIGS. 15A and 15B are cross sectional diagrams showing a sealed structure of an EL display device of Embodiment 1.
Figure 15B:
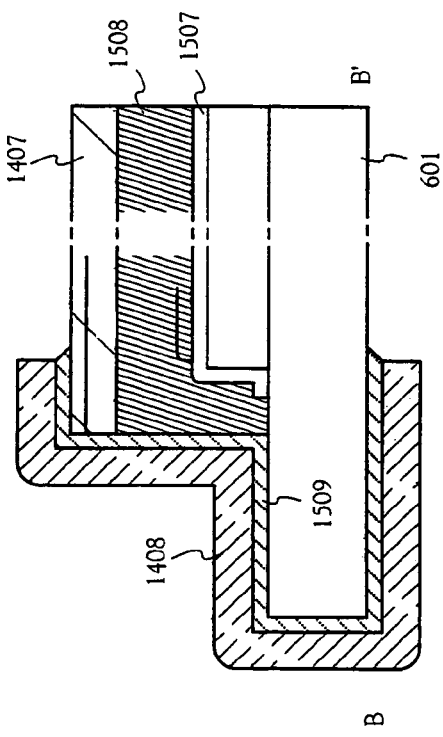

A cross sectional diagram of FIG. 14 cut along the line A-A' is shown in FIG. 15A, and a cross sectional diagram of FIG. 14 cut along the line B-B' is shown in FIG. 15B. Note that in FIGS. 15A and 15B, identical numerals are used for portions identical to those of FIG. 14.

As shown in FIG. 15A, the pixel portion 602 and the driver circuit 603 are formed on the substrate 601, and the pixel portion 602 is composed of a plurality of pixels containing an current control TFT 1501 and a pixel electrode 1502 electrically connected to the current control TFT 1501. The pixel electrode 1502 functions as an anode of an EL element. Further, an EL layer 1503 is formed covering the pixel electrode 1502, and a cathode 1504 of the EL element is formed on the EL layer 1503.

The cathode 1504 also functions as a common wiring among all pixels, and is electrically connected to the FPC 611 via the connection wirings 612. In addition, the element containing the pixel portion 602 and the driver circuit 603 is completely covered by a passivation film 1507.

Additionally, a filler material 1508 is formed covering the EL element. The filler material 1508 functions as an adhesive for bonding the covering material 1407. PVC (polyvinyl chloride), epoxy resin, silicone resin, PVB (polyvinyl butyral), and EVA (ethylene vinyl acetate) can be used as the filler material 1508. If a drying agent is formed on the inside of the filler material 1508, then it can continue to maintain a moisture absorbing effect, which is preferable.

Further, materials such as a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 1407. Note that when using PVB or EVA as the filler material 1508, it is preferable to use a sheet structure in which several tens of μm of aluminum foil is sandwiched by a PVF film or a Mylar film.

Note that, depending on the emission direction of light emitted from the EL element, it is necessary for the covering material 1407 to possess transparency. In other words, for the case of FIGS. 15A and 15B, light is irradiated to the side opposite that of the covering material 1407, and therefore the material properties do not matter, but for a case in which the light is irradiated to the covering material 1407 side, a highly transparent material is used.

Next, after bonding the covering material 1407 using the filler material 1508, the frame material 1408 is attached so as to cover the side surface (exposed surface) of the filler material 1508. The frame material 1408 is bonded by a sealing material (which functions as a sealant) 1509. It is preferable to use a photo curing resin as the sealing material 1509 at this point, but a thermally curable resin may also be used provided that the thermal resistance of the EL layer permits. Note that it is preferable that the sealing material 1509 be a material through which as little moisture and oxygen as possible are transmitted. Further, a drying agent may also be added to the inside of the sealing material 1509.

By sealing the EL element in the filler material 1508 using the above method, the EL element can be completely shut off from the outside, and the incursion of substances from the outside which promote degradation by oxidation of the EL layer through moisture, oxygen, etc. can be prevented. An EL display device having high reliability can therefore be manufactured.

Embodiment 2

An EL display device having a form in which light emitted by an EL element is irradiated to the side of a substrate on which TFTs are formed is shown in Embodiment 1. For this case, at least the region in which the TFTs are formed becomes shadow, and the aperture ratio of a pixel portion is reduced by that amount. On the other hand, if a form is used in which light emitted by the EL element is irradiated in the upward direction (the side of the substrate opposite that on which the TFTs are formed), then at least it becomes easy to increase the aperture ratio.

Figure 18:
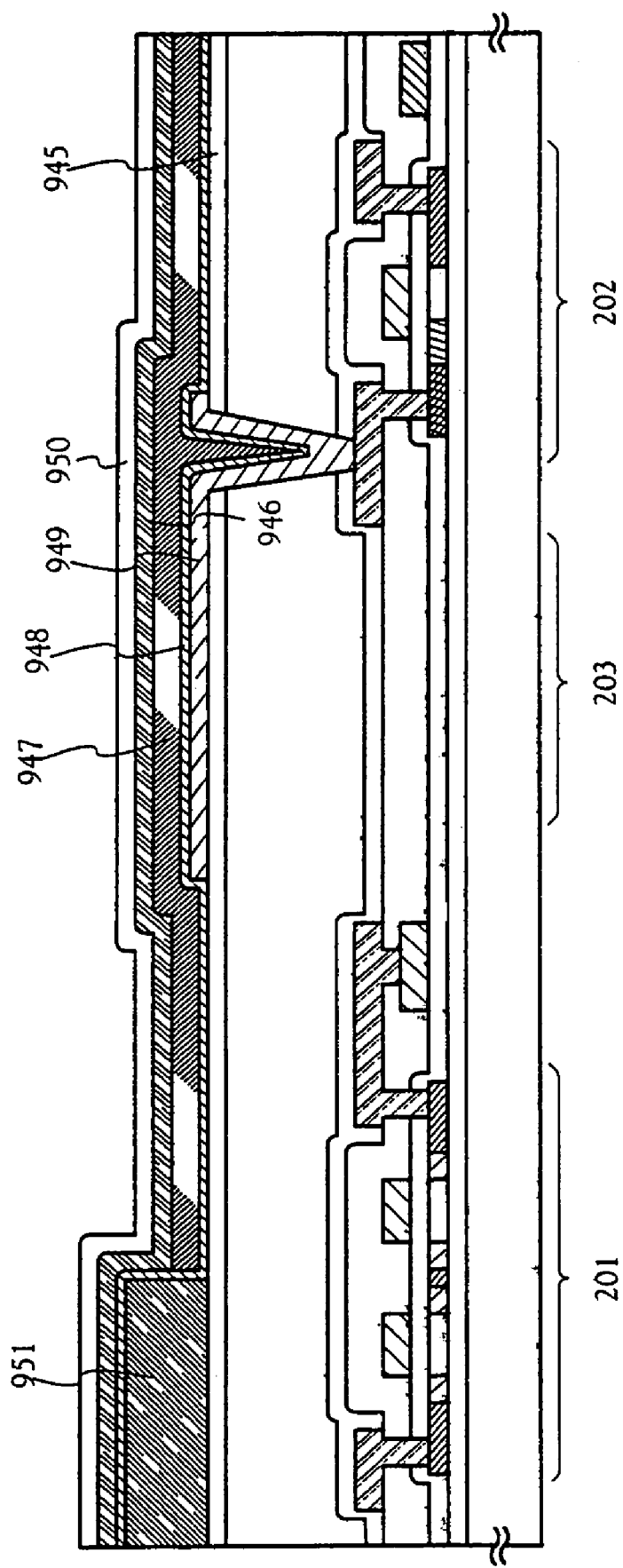
FIG. 18 is a diagram showing the cross sectional structure of the pixel portion of an EL display device of Embodiment 2.

FIG. 18 shows the structure of an EL display element in which tight is irradiated in the upward direction. The structures of the switching TFT 201 and the current control TFT 202 are the same as those of Embodiment Mode 2, and the differences in other portions is explained here.

A cathode side pixel electrode 949 connected to the drain side of the current control TFT 202 is formed on a second passivation layer 945. A separation layer 951 is formed from an organic resin material. The cathode 948 is formed using a material such as MgAg (a material in which Mg and Ag are combined at a ratio of Mg:Ag=10:1), MgAgAl, LiAl, or LiFAl.

The EL layer 947 is also formed by an ink-jet method similar to that of Embodiment Mode 1 or Embodiment Mode 2. In addition, an anode side pixel electrode is formed from a transparent conducting material such as ITO, and a third passivation film 950 is formed on the anode side pixel electrode, completing the EL display element in which light is irradiated in the upward direction.

Embodiment 3

The method of manufacturing an EL layer by an ink-jet method, and the manufactured EL layer according to the present invention, can also be applied to a passive type EL display device. An example of such is explained with reference to FIGS. 16A to 16E.

Figure 16A:
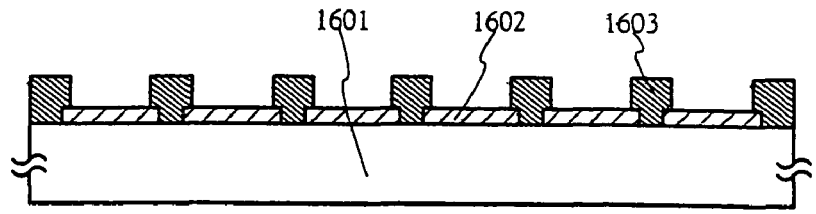
FIGS. 16A to 16E are diagrams showing a manufacturing process of a passive type EL display device of Embodiment 3.

A substrate such as: a non-alkaline glass substrate, typically a Corning Corp. # 1737 glass substrate; a crystalline glass substrate; a soda lime glass substrate on whose surface a silicon oxide film or a silicon nitride film is formed; or a plastic substrate can be applied to a substrate 1601 in FIG. 16A. A transparent electrode 1602 is formed with a film thickness of 50 to 200 μm on the substrate 1601, and is partitioned into a plurality of strip shapes by a process such as etching or lift-off. The transparent electrode 1601 is formed from a material such as ITO, ZnO, $SnO_2$, or ITO-ZnO. Then, using an organic resin material such as polyimide, separating layers 1603 are formed with a thickness of 0.5 to 2 μm so as to contact the side edge portions of the transparent electrode 1602 formed into the strip shapes.

Figure 16B:
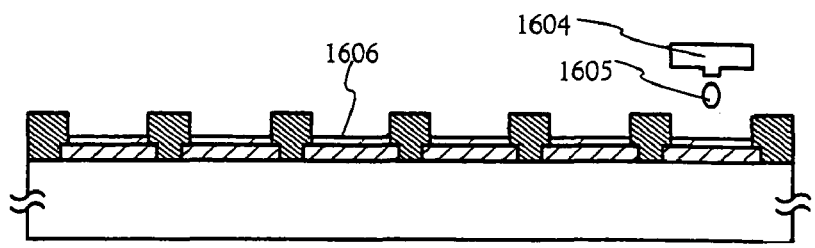

The EL layer uses a single layer or a lamination structure. A lamination structure is a structure in which a combination of layers such as a light emitting layer, an electron transporting layer, an electron injecting layer, a hole injecting layer, and a hole transporting layer are combined and laminated, and in Embodiment 3 a hole injecting layer and a light emitting layer are formed into a lamination structure. First, as shown in FIG. 16B, a hole injecting layer 1606 is formed. The hole injecting layer is not always necessary, but there are instances in which it is preferable to form it in order to increase the light emitting efficiency. As shown by Embodiment Mode 1, the hole injecting layer is formed from an organic material containing tetra-allyl-diamine. An ink-jet method is used for this case as well, and a solution 1605 discharged from an ink head 1604 is formed into a stripe shape, or into an oblong shape or a rectangular shape of a plurality of dots which are continuous, between the separating layers. This is heated at a temperature on the order of 100° C. by a means such as a hot plate, evaporating components such as unnecessary moisture.

Figure 16C:
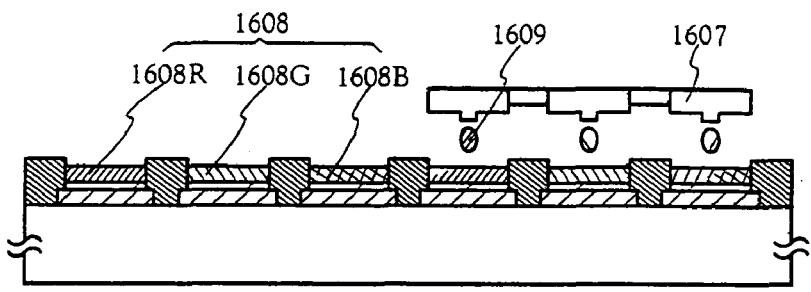

The light emitting layer is also formed by an ink-jet method, as shown in FIG. 16C. For color display, an ink head having a cylinder for each of the colors such as red, green, and blue is used, and an EL forming solution 1609 containing a light emitting material is discharged on the hole injecting layer. As a preferable EL material for a light emitting layer 1608, there can be given a polymer material such as polyparaphenylene vinylene (PPV) or polyfluorene. For colorization, it is preferable to use, for example, a cyano-paraphenylene vinylene in a red light emitting material; a paraphenylene vinylene in a green light emitting material; and a polyphenylene vinylene or a polyalkylphenylene in a yellow light emitting material. Thus light emitting layers 1608R, 1608G, and 1608B, corresponding to the colors red, green, and blue, respectively, are formed so as to form stripes, or in an oblong shape or a rectangular shape in which a plurality are made continuous. In order to prevent the EL material from oxidizing and deteriorating during formation in the ink-jet method as well, it is performed in an inert gas atmosphere such as nitrogen or argon.

Figure 16D:
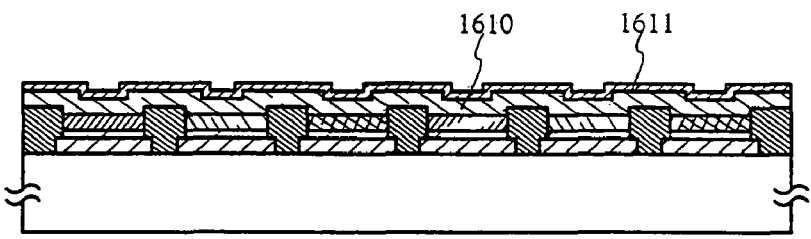
Figure 16E:
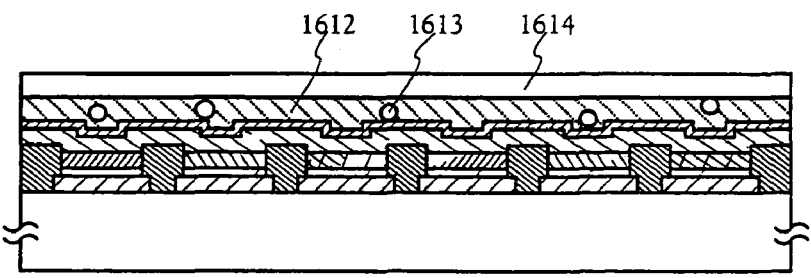

A cathode material is then formed using a material such as MgAg (a material in which Mg and Ag are combined at a ratio of Mg:Ag=10:1), MgAgAl, LiAl, or LiFAl. The cathode material is typically formed with a thickness of 1 to 50 nm by vacuum evaporation. In addition, a material such as Al is laminated on the cathode as an auxiliary electrode. A cathode layer 1610 of FIG. 16D shows this type of structure, and strip shapes are formed using a masking material at the time of each film formation. The cathode layers 1610 formed into the strip shapes are formed so as to be nearly orthogonal to the transparent electrodes 1602 which are similarly formed into strip shapes. A passivation film 1611 is formed on the cathode layers 1610 from a film such as a silicon nitride film or a silicon nitride oxide film.

The materials which form the EL layer shown here are weak with respect to moisture and humidity, and therefore it is preferable to seal them by a housing material. It is preferable to use an insulating substance such as a glass or a polymer for a housing material 1614. For example, materials such as an amorphous glass (such as a borosilicate glass or quartz), a crystallized glass, a ceramic glass, an organic resin (such as an acrylic resin, a styrene resin, a polycarbonate resin, or an epoxy resin), and a silicone resin can be given. A ceramic may also be used. Furthermore, provided that a sealant 1705 is an insulating substance, it is also possible to use a metallic material such as a stainless steel alloy.

Further, it is possible to use an adhesive such as an epoxy resin or an acrylate resin for an adhesive 1612 which joins the housing material 1614 to the substrate on which the EL layers are formed. In addition, a thermally curable resin or a photo curing resin can be used as the adhesive. Note that it is necessary for the material to transmit as little oxygen and moisture as possible. A drying agent 1613 such as barium oxide may also be mixed into the adhesive 1612. The passive type EL display device can thus be formed.

Embodiment 4

Figure 17:
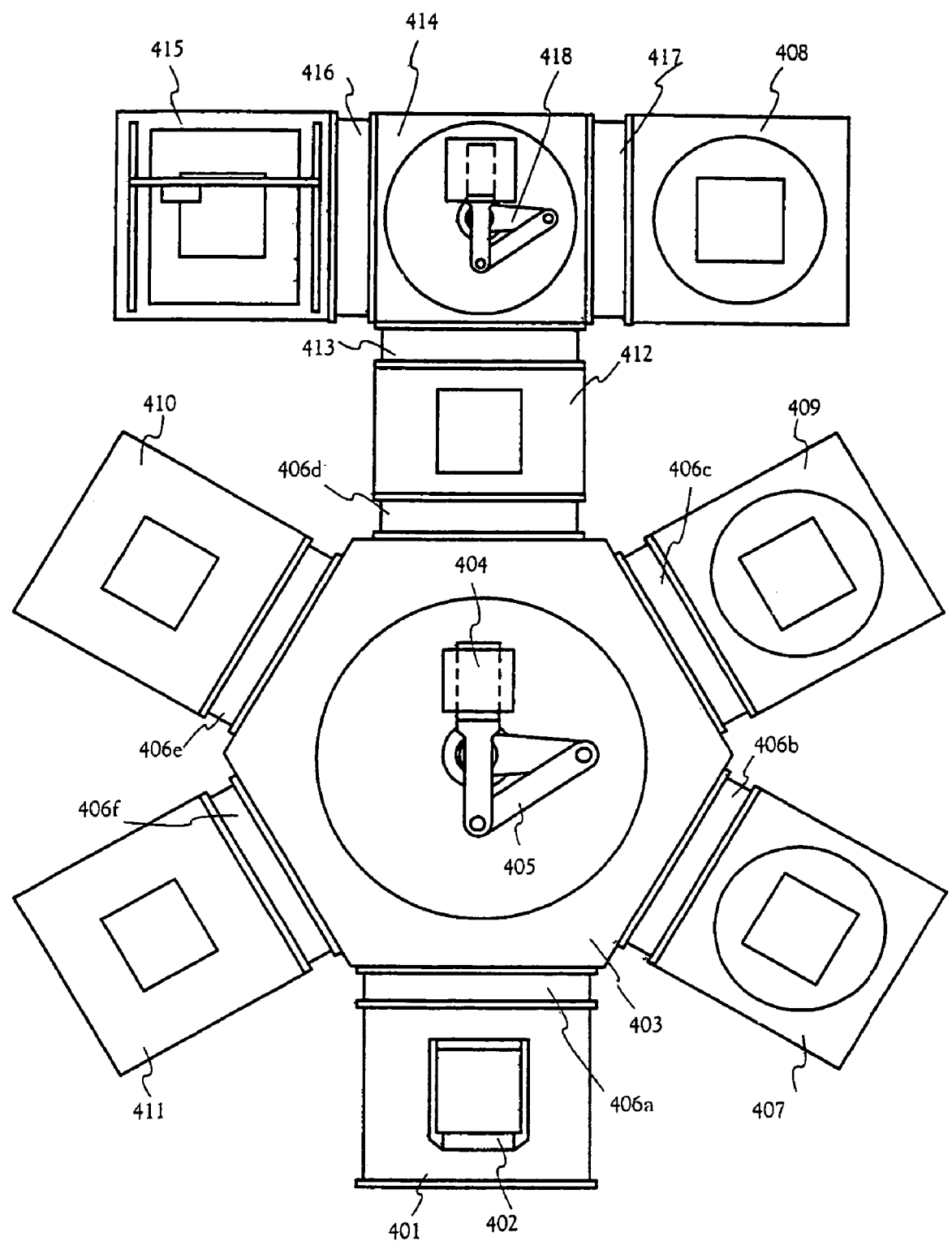
FIG. 17 is a diagram for explaining the structure of an apparatus for manufacturing an EL display device of Embodiment 4.

An example of a thin film forming apparatus for forming an EL element is shown in FIG. 17. Shown in FIG. 17 is an apparatus which forms a polymer organic EL layer as a light emitting layer, a metallic film containing a periodic table group 1 or group 2 element as a cathode layer, a conductive film such as Al as a supplementary electrode, and a passivation film in succession.

In FIG. 17, reference numeral 401 denotes a conveying chamber, also referred to as a load-unload chamber, which performs loading and unloading of a substrate. A carrier 402 on which the substrate is set is placed here. Note that the conveying chamber 401 may also be separated into a substrate loading chamber and a substrate unloading chamber. Further, reference numeral 403 is a common chamber containing a mechanism (hereafter referred to as a conveying mechanism)

405 for conveying a substrate 404. Mechanisms such as a robot arm for performing handling of the substrate are one type of conveying mechanism (1) 405.

A plurality of processing chambers are connected to the common chamber 403 through gates 406a to 406f. With the structure of FIG. 17, the common chamber 403 is reduced in pressure to a level from several mTorr to several tens of mTorr, and each processing chamber is cut off from the common chamber 403 by the gates 406a to 406f. In this case, processing is performed in an ink-jet printing processing chamber 415 and a spin coating processing chamber 408 under an inert gas such as nitrogen or argon under normal pressure, and therefore this is a structure in which a vacuum evacuation processing chamber 412 is formed between the chambers 415 and 416, and the common chamber 403.

By placing an evacuation pump in each processing chamber which performs predetermined work at low pressure, it becomes possible to perform processing under a vacuum. It is possible to use a rotary oil pump, a mechanical booster pump, a turbo-molecular pump, or a cryo-pump for the evacuation pumps, and a cryo-pump which is effective at removing moisture is preferable.

The formation of an EL layer composed of a light emitting layer and an injecting layer is performed in the ink-jet printing processing chamber 415 or in the spin coating processing chamber 408. Components such as a means of maintaining the substrate and the ink head explained by FIGS. 3A and 3B are placed in the ink-jet printing processing chamber 415. Further, as stated above, organic EL materials are extremely weak with respect to moisture, and therefore an inert atmosphere is maintained at all times in the ink-jet printing processing chamber 415 and the spin coating processing chamber 408.

Regarding conveyance of the substrate, first the vacuum evacuation processing chamber 412 is reduced in pressure until its pressure is the same as the common-chamber 403, the gate 406d is open in that state, and the substrate is conveyed. Then, after the gate 406d closes, the inside of the vacuum evacuation processing chamber 412 is purged by an inert gas, and a gate 413 is opened at the point where the pressure has returned to standard pressure, and the substrate is conveyed to the ink-jet printing processing chamber 415 and to the spin coating processing chamber 408 by a conveying mechanism (2) 418 in a substrate conveyor chamber 414.

The organic EL layer is formed by the ink-jet method in the present invention, but the organic EL layer may also be formed by suitably combining both ink-jet and spin coating methods. The light emitting layer may be formed by the ink-jet method, and a portion of the layers, such as a hole or electron injecting layer, or a hole or electron transporting layer, may be formed by spin coating.

After completing the EL layer formation process, the gate 413 is opened and the substrate is conveyed to the vacuum evacuation processing chamber 412, and vacuum evacuation is performed in a state where the gate 413 and the gate 406d are closed. After the vacuum evacuation processing chamber 412 has reached the same low pressure state as the common chamber 403, the gate 406d opens and the substrate is conveyed to the common chamber.

Note that a firing processing chamber 409 is included here, but firing processing may also be performed by making a susceptor of the vacuum evacuation processing chamber 412 capable of heating. After firing, it is possible to induce outgassing by vacuum evacuation.

Formation of a cathode is performed in a first film deposition processing chamber 410. A known material is used to form the cathode. The cathode is formed by vacuum evaporation, and the surface of the substrate (the surface on which a polymer EL layer is formed) at that time may be facing up (face-up method) or facing down (face-down method).

In the face-up method, the substrate conveyed from the common chamber 403 may be set in the susceptor as is, and therefore it is an extremely easy method. In the face-down method, it is necessary to prepare a mechanism for turning over the substrate in the conveyor mechanism (1) 405 or in the first film deposition processing chamber 410, and therefore the conveyor mechanism is complex. However, an advantage of little contaminant adhesion can be obtained.

Note that when performing evaporation processing in the first film deposition processing chamber 110, it is necessary to prepare an evaporation source. A plurality of evaporation sources may also be prepared. Further, a resist heating method evaporation source may be used, and an EB (electron beam) evaporation source may also be used.

A second film deposition processing chamber 411 is a processing chamber for forming an electrode by a vapor phase film deposition method. The formation of the auxiliary electrode for supplementing the cathode is performed here. Further, evaporation or sputtering is used, but evaporation is preferred because the evaporation method is less likely to impart damage. Whichever is used, the common chamber 403 is cut off by the gate 406f, and film deposition is performed under a vacuum. Note that when performing evaporation as the vapor phase film deposition method, it is necessary to provide an evaporation source. The evaporation source may be similar to that of the first vapor phase film deposition processing chamber 410, and therefore an explanation regarding the evaporation source is omitted here.

Metallic films containing an element from periodic table group 1 or group 2 are often used as the cathode, but these metallic films are easily oxidized, and therefore it is preferable to protect the surface of the cathode. Further, the required film thickness is thin, and therefore a conductive film having a low resistivity is supplementally formed, lowering the resistance of the cathode, and in addition, protecting the cathode. A metallic film in which aluminum, copper, or silver is the main constituent is used as the low resistivity conductive film.

Next, a third film deposition processing chamber 407 is a processing chamber for forming a third passivation film. The third passivation film is formed by plasma CVD from a silicon nitride film, a silicon nitride oxide film, or the like. Therefore, although not shown in the figure, components such as a system for supplying $SiH_4$, $N_2O$, and $NH_3$ gases, a means of plasma generation using a 13.56 to 60 MHZ high frequency power source, and a means of heating the substrate are provided. EL layers made from organic materials are weak with respect to moisture and humidity, and therefore this type of passivation film may be formed in succession, without exposure to the atmosphere, after forming the EL layers.

The most important characteristic of the thin film forming apparatus having the above structure is that formation of the EL layers is performed by the ink-jet method, and that the means of forming the EL layers is loaded into a multi-chamber type thin film forming apparatus along with the means of forming the cathode. Therefore, beginning with a process of surface oxidation on the anode made from a transparent conductive film, and continuing through the process of forming the auxiliary electrode, it is possible to perform all processes without the substrate even once being exposed to the atmosphere. As a result, it becomes possible to form the polymer EL layer, strong against degradation, by a simple means, and it becomes possible to manufacture an EL display device having high reliability.

Embodiment 5

Laser crystallization is used as the means of forming the crystalline silicon film 302 in embodiment 1, and a case of using a different means of crystallization is explained in embodiment 5.

After forming an amorphous silicon film in embodiment 5, crystallization is performed using the technique recorded in Japanese Patent Application Laid-open No. Hei 7-130652. The technique recorded in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602. In addition, a TFT may be formed using the technique recorded in the specification of Japanese Patent Application Serial No. Hei 11-076967 by the applicant of the present invention.

The processes of manufacturing shown in embodiment 1 are one embodiment of the present invention, and provided that the structure of FIG. 5 or of FIG. 9C of embodiment 1 can be realized, then other manufacturing process may also be used without any problems, as above. Note that it is possible to freely combine the constitution of embodiment 5 with the constitution of any of embodiment mode 2 or embodiments 1 to 2.

Embodiment 6

An active matrix type EL display device or a passive type EL display device (EL module) formed by implementing the present invention has superior visibility in bright locations in comparison to a liquid crystal display device because it is a self-emitting type device. It therefore has a wide range of uses as a direct-view type EL display (indicating a display incorporating an EL module).

Note that a wide viewing angle can be given as one advantage which the EL display has over a liquid crystal display. The EL display of the present invention may therefore be used as a display (display monitor) having a diagonal equal to 30 inches or greater (typically equal to 40 inches or greater) for appreciation of TV broadcasts by large screen.

Further, not only can it be used as an EL display (such as a personal computer monitor, a TV broadcast reception monitor, or an advertisement display monitor), it can be used as a display for various electronic devices. The following can be given as examples of such electronic devices: a video camera; a digital camera; a goggle type display (head mounted display); a car navigation system; a personal computer; a portable information terminal (such as a mobile computer, a mobile telephone, or an electronic book); and an image reproduction device using a recording medium (specifically, a device which performs reproduction of a recording medium and is provided with a display which can display those images, such as a compact disk (CD), a laser disk (LD), or a digital video disk (DVD)). Examples of these semiconductor devices are shown in FIGS. 19A to 20B.

Figure 19A:
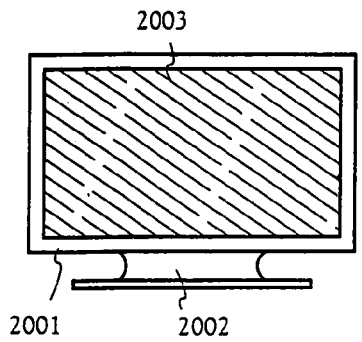
FIGS. 19A to 19F are diagrams showing specific examples of electronic equipment of Embodiment 6.

FIG. 19A is an EL display, comprising a body 2001, a support stand 2002, and a display portion 2003. The present invention can be used in the display portion 2003. They are especially advantageous for cases in which the screen is made large, and is favorable for displays having a diagonal greater than or equal to 10 inches (especially one which is greater than or equal to 30 inches).

Figure 19B:
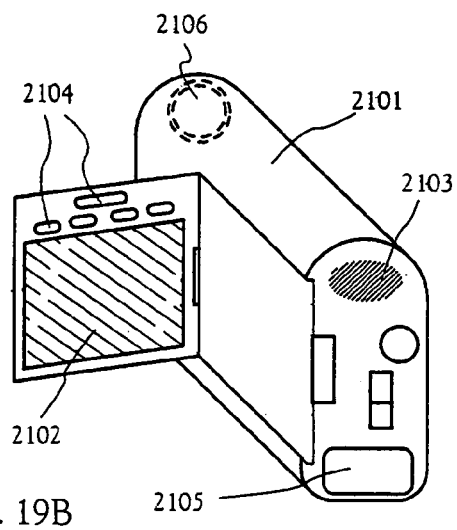

FIG. 19B is a video camera, comprising a main body 2101, a display portion 2102, an audio input portion 2103, operation switches 2104, a battery 2105, and an image receiving portion 2106. The present invention can be used in the display portion 2102.

Figure 19C:
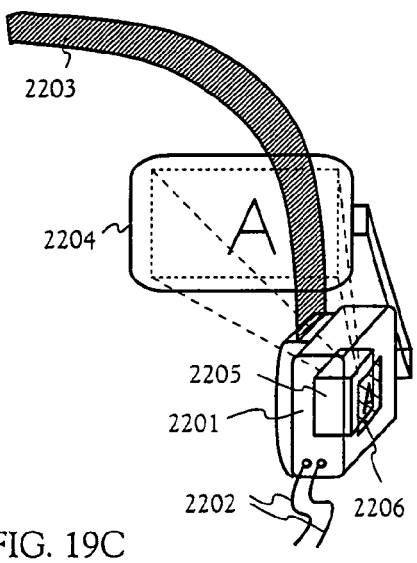

FIG. 19C is a portion of a head-mounted type display, comprising a main body 2201, a signal cable 2202, a fasting band 2203, a display monitor 2204, an optical system 2205 and a EL display device 2206. The present invention can be used in the display device 2206. The structure is to project the image information, which is projected by EL display device 2206, on a display portion 2204 by an optical light system. The present invention is used to the display device 2206.

Figure 19D:
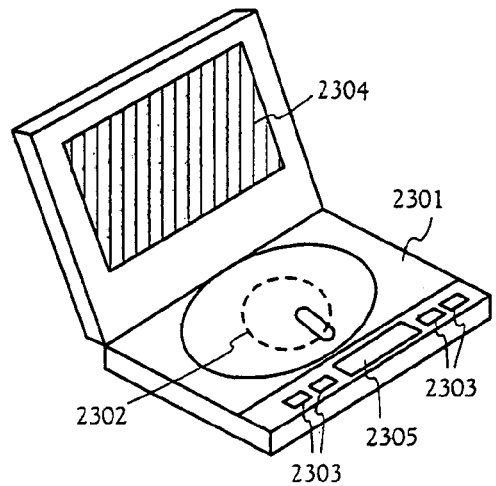

FIG. 19D is an image reproduction device (specifically, a DVD reproduction device) provided with a recording medium, comprising a main body 2301, a recording medium (such as a CD, an LD, or a DVD) 2302, operation switches 2303, a display portion (a) 2304, and a display portion (b) 2305. The display portion (a) is mainly used for displaying image information, and the image portion (b) is mainly used for displaying character information, and the present invention can be used in the image portion (a) and in the image portion (b). Note that the present invention can be used as an image reproduction device provided with a recording medium in devices such as a CD reproduction device and game equipment.

Figure 19E:
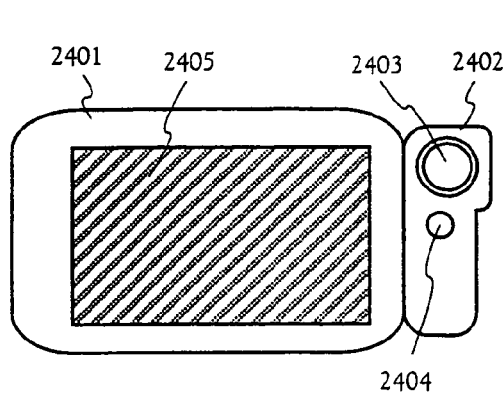

FIG. 19E is a mobile computer, comprising a main body 2401, a camera portion 2402, an image receiving portion 2403, operation switches 2404, and a display portion 2405. The present invention can be used in the display portion 2405.

Figure 19F:
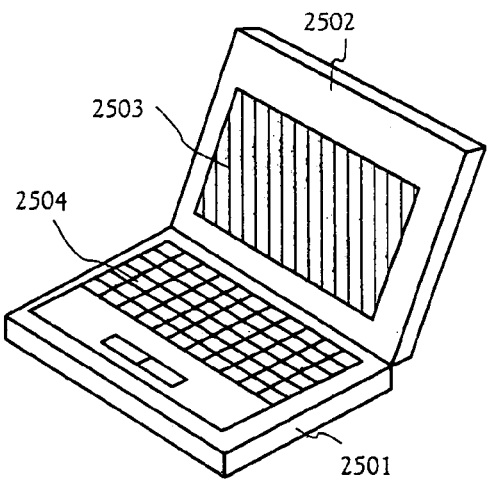

FIG. 19F is a personal computer, comprising a main body 2501, a display portion 2503, and a keyboard 2504. The present invention can be used in the display portion 2503.

Figure 20A:
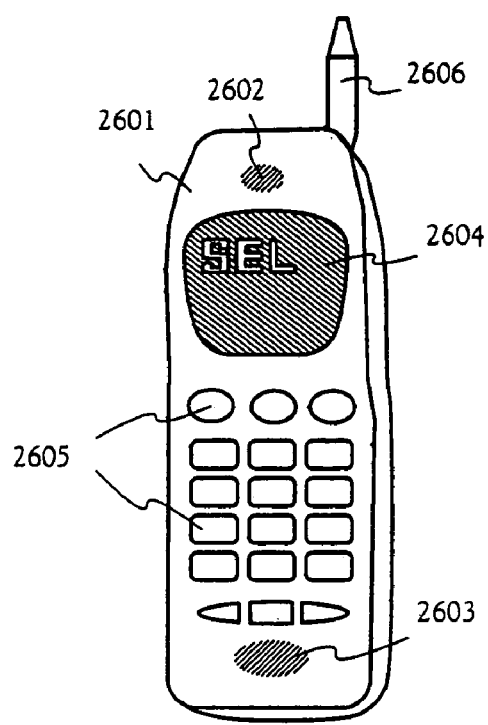
FIGS. 20A and 20B are diagrams showing specific examples of electronic equipment.

FIG. 20A is a mobile phone, comprising a main body 2601, an audio output portion 2602, an audio input portion 2603, a display portion 2604, an operation switches 2605, an antenna 2606. The EL display device is a low power consumption, and can be good used for display portion 2604.

Figure 20B:
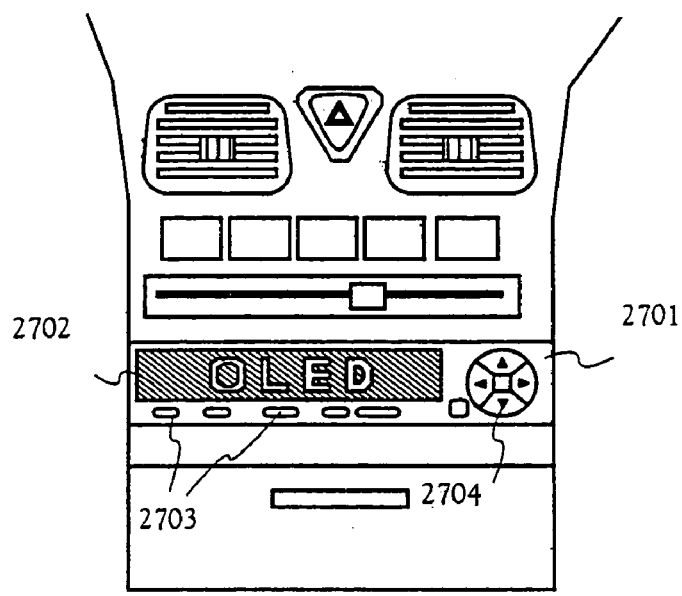

FIG. 20B is a car audio equipment of the mount type, comprising a main body 2701, display portion 2702, operation switches 2703, 2704. The EL display device in accordance with the present invention can be good used as the display portion 2702, because the EL display device has a wide viewing angle and exhibits excellent recognizability.

The range of applications of the present invention is thus extremely wide, and it is possible to apply the present invention to electronic devices in all fields. Furthermore, the electronic devices of embodiment 6 can be realized by using any constitution of any combination of embodiments 1 to 5.

Embodiment 7

Figure 22:
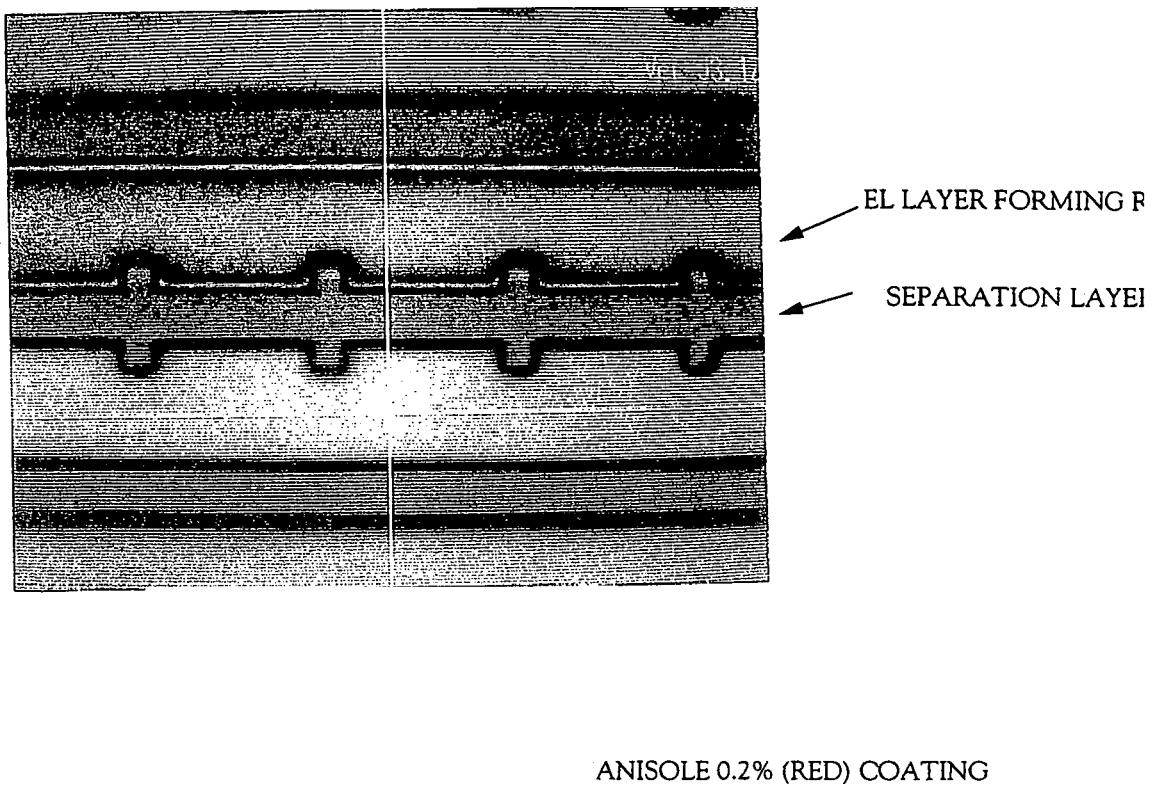
FIG. 22 is a microscope photograph of a test piece on which EL layers are formed continuously by the ink-jet method of Embodiment 7.

FIG. 22 shows a microscopic photograph of a test piece on which an EL layer is formed using the ink-jet method of the present invention. The structure of the sample piece has a pixel electrode formed from ITO on an insulating film formed from an acrylic resin, and separation layers formed from a light-sensitive acrylic resin formed so as to form stripes.

A PEDOT layer is first formed on the ITO by a liquid coating method (spin coating). The ITO is hydrophobic at this point, and therefore oxygen plasma processing and $CF_4$ plasma processing are performed in order to make it hydrophilic.

The EL layer is formed by the ink-jet method using PPV dissolved in anisole at a ratio of 0.04 g to 20 mg, respectively. The gap between separation layers is 60 μm, and it can be seen that the EL layers are formed in a continuous state between separation layers simple, high-speed processing for EL layer formation thus becomes possible.

Employment of the present invention makes it possible to form EL layers by simple processing and at a high speed. Also, degradation of EL elements from moisture or heat can be suppressed. Moreover, the invention prevents an alkali metal from diffusing from the EL layers and thereby affecting TFT characteristics. As a result, the operation performance and reliability of an EL display device can be greatly increased.

Furthermore, by using this type of EL display device as a display, it becomes possible to produce applied products (electronic device) having good image quality and durability (high reliability).

[Chem 1]

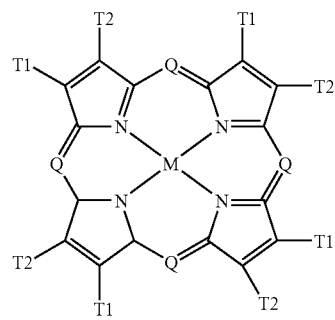

[Chem 2]

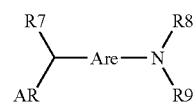

[Chem 3]

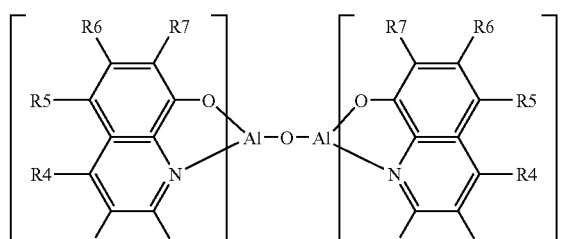

[Chem 4]

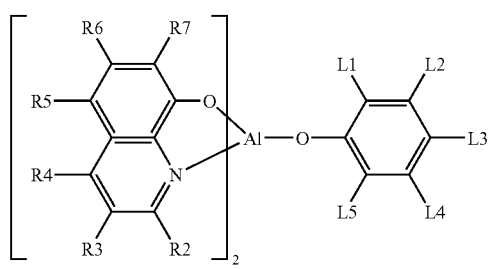

[Chem 5]

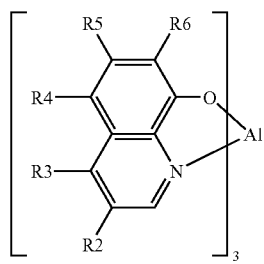

[Chem 6]

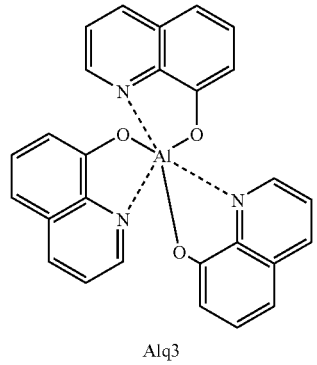

Alq3

[Chem 7]

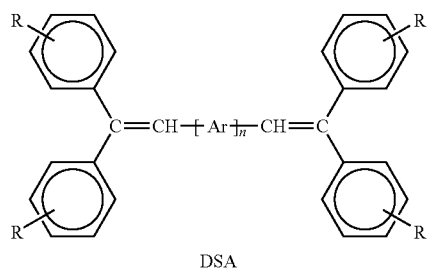

DSA

What is claimed is:

1. A light-emitting device comprising:
a plurality of TFTs over a substrate;
a first passivation film over the plurality of TFTs;
a leveling film over the first passivation film;
a second passivation film over the leveling film;
a plurality of first pixel electrodes and a plurality of second pixel electrodes over the second passivation film, the plurality of first pixel electrodes and the plurality of second pixel electrodes each being connected to one of the plurality of TFTs;
a first separation layer, a second separation layer and a third separation layer each extending in a line over the second passivation film so that the plurality of first electrodes are arranged between the first separation layer and the second separation layer and the plurality of second electrodes are arranged between the second separation layer and the third separation layer;
a first EL layer over the plurality of first pixel electrodes, the first EL layer extending along the first separation layer and the second separation layer; and
a second EL layer over the plurality of second pixel electrodes, the second EL layer extending along the second separation layer and the third separation layer,
wherein the first EL layer is formed to be continuous over the plurality of first pixel electrodes, and
wherein the second EL layer is formed to be continuous over the plurality of second pixel electrodes.

2. A light-emitting device according to claim 1,
wherein the second passivation film is formed for preventing transmission of alkali metals.

3. A device according to claim 2,
wherein a gap between adjacent pixels of a plurality of pixels is in a range of 5 to 10 times of a thickness of at least one of the first EL layer and the second EL layer.

4. A device according to claim 3, wherein the gap is in a range of 250-2500 nm.

5. A device according to claim 2, wherein each of the first and second EL layers comprises an organic material.

6. A device according to claim 1,
wherein a gap between adjacent pixels of a plurality of pixels is in a range of 5 to 10 times of a thickness of at least one of the first EL layer and the second EL layer.

7. A device according to claim 6, wherein the gap is in a range of 250-2500 nm.

8. A device according to claim 1, wherein each of the first and second EL layers comprises an organic material.

9. A device according to claim 1, wherein the second passivation film comprises an organic resin material.

10. A device according to claim 1, wherein the second passivation film comprises at least one element selected from the group consisting of B (boron), C (carbon), and N (nitrogen), Al (aluminum), Si (silicon), and P (phosphorous).

11. A device according to claim 1, wherein the second passivation film comprises Si, Al, N, O, and M, wherein M denotes at least one rare earth element.

12. A light-emitting device comprising:
a plurality of TFTs over a substrate;
a first passivation film over the plurality of TFTs;
a leveling film over the first passivation film;
a second passivation film over the leveling film;
a plurality of first pixel electrodes and a plurality of second pixel electrodes over the second passivation film, the plurality of first pixel electrodes and the plurality of second pixel electrodes each being connected to one of the plurality of TFTs;
a first separation layer, a second separation layer and a third separation layer each extending in a line over the second passivation film so that the plurality of first electrodes are arranged between the first separation layer and the second separation layer and the plurality of second electrodes are arranged between the second separation layer and the third separation layer;
a first EL layer over the plurality of first pixel electrodes, the first EL layer extending along the first separation layer and the second separation layer; and
a second EL layer over the plurality of second pixel electrodes, the second EL layer extending along the second separation layer and the third separation layer,
wherein the first EL layer is formed to be continuous over the plurality of first pixel electrodes and has an oblong shape or a rectangular shape corresponding to the plurality of first pixel electrodes, and
wherein the second EL layer is formed to be continuous over the plurality of second pixel electrodes and has an oblong shape or a rectangular shape corresponding to the plurality of second pixel electrodes.

13. A light-emitting device according to claim 12,
wherein the second passivation film is formed for preventing transmission of alkali metals.

14. A device according to claim 13,
wherein a gap between adjacent pixels of a plurality of pixels is in a range of 5 to 10 times of a thickness of at least one of the first EL layer and the second EL layer.

15. A device according to claim 14, wherein the gap is in a range of 250-2500 nm.

16. A device according to claim 13, wherein each of the first and second EL layers comprises an organic material.

17. A device according to claim 12,
wherein a gap between adjacent pixels of a plurality of pixels is in a range of 5 to 10 times of a thickness of at least one of the first EL layer and the second EL layer.

18. A device according to claim 17, wherein the gap is in a range of 250-2500 nm.

19. A device according to claim 12, wherein each of the first and second EL layers comprises an organic material.

20. A device according to claim 12, wherein the second passivation film comprises an organic resin material.

21. A device according to claim 12, wherein the second passivation film comprises at least the element selected from the group consisting of B (boron), C (carbon), and N (nitrogen), Al (aluminum), Si (silicon), and P (phosphorous).

22. A device according to claim 12, wherein the second passivation film comprises Si, Al, N, O, and M, wherein M denotes at least one rare earth element.

23. A light-emitting device comprising:
a plurality of first TFTs over a substrate;
a plurality of second TFTs over the substrate;
a plurality of third TFTs over the substrate;
a first passivation film over the plurality of first TFTs, the plurality of second TFTs and the plurality of third TFTs;
a leveling film over the first passivation film;
a second passivation film over the leveling film;
a plurality of first pixel electrodes over the the second passivation film, the plurality of first pixel electrodes each being connected to one of the plurality of first TFTs;
a plurality of second pixel electrodes over the the second passivation film, the plurality of second pixel electrodes each being connected to one of the plurality of second TFTs;
a plurality of third pixel electrodes over the the second passivation film, the plurality of third pixel electrodes each being connected to one of the plurality of third TFTs;
a first separation layer, a second separation layer, a third separation layer and a fourth separation layer each extending in a line over the second passivation film so that the plurality of first electrodes are arranged between the first separation layer and the second separation layer, the plurality of second electrodes are arranged between the second separation layer and the third separation layer, and the plurality of third electrodes are arranged between the third separation layer and the fourth separation layer;
a first EL layer for emitting a red color light over the plurality of first pixel electrodes, the first EL layer extending along the first separation layer and the second separation layer;
a second EL layer for emitting a green color light over the plurality of second pixel electrodes, the second EL layer extending along the second separation layer and the third separation layer; and
a third EL layer for emitting a blue color light over the plurality of third pixel electrodes, the third EL layer extending along the third separation layer and the fourth separation layer,
wherein the first EL layer is formed to be continuous over the plurality of first pixel electrodes,
wherein the second EL layer is formed to be continuous over the plurality of second pixel electrodes, and wherein the third EL layer is formed to be continuous over the plurality of third pixel electrodes.

24. A light-emitting device according to claim 23, wherein the second passivation film is formed for preventing transmission of alkali metals.

25. A device according to claim 24,
wherein a first gap between adjacent pixels of a plurality of first pixels is in a range of 5 to 10 times of a thickness of the first EL layer,
wherein a second gap between adjacent pixels of a plurality of second pixels is in a range of 5 to 10 times of a thickness of the second EL layer, and
wherein a third gap between adjacent pixels of a plurality of third pixels is in a range of 5 to 10 times of a thickness of the third EL layer.

26. A device according to claim 25, wherein the gap is in a range of 250-2500 nm.

27. A device according to claim 24, wherein each of the first, second and third EL layers comprises an organic material.

28. A device according to claim 23,
wherein a gap between adjacent pixels of a plurality of first pixels is in a range of 5 to 10 times of a thickness of the first EL layer,
wherein a gap between adjacent pixels of a plurality of second pixels is in a range of 5 to 10 times of a thickness of the second EL layer, and
wherein a gap between adjacent pixels of a plurality of third pixels is in a range of 5 to 10 times of a thickness of the third EL layer.

29. A device according to claim 28, wherein the gap is in a range of 250-2500 nm.

30. A device according to claim 23, wherein each of the first, second and third EL layers comprises an organic material.

31. A device according to claim 23, second passivation film comprises an organic resin material.

32. A device according to claim 23, wherein the second passivation film comprises at least the element selected from the group consisting of B (boron), C (carbon), and N (nitrogen), Al (aluminum), Si (silicon), and P (phosphorous).

33. A device according to claim 23, wherein the second passivation film comprises Si, Al, N, O, and M, wherein M denotes at least one rare earth element.

34. A light-emitting device comprising:
a plurality of first TFTs over a substrate;
a plurality of second TFTs over the substrate;
a plurality of third TFTs over the substrate;
a first passivation film over the plurality of first TFTs, the plurality of second TFTs and the plurality of third TFTs;
a leveling film over the first passivation film;
a second passivation film over the leveling film;
a plurality of first pixel electrodes over the the second passivation film, the plurality of first pixel electrodes each being connected to one of the plurality of first TFTs;
a plurality of second pixel electrodes over the the second passivation film, the plurality of second pixel electrodes each being connected to one of the plurality of second TFTs;
a plurality of third pixel electrodes over the the second passivation film, the plurality of third pixel electrodes each being connected to one of the plurality of third TFTs;
a first separation layer, a second separation layer, a third separation layer and a fourth separation layer each extending in a line over the second passivation film so that the plurality of first electrodes are arranged between the first separation layer and the second separation layer, the plurality of second electrodes are arranged between the second separation layer and the third separation layer, and the plurality of third electrodes are arranged between the third separation layer and the fourth separation layer;
a first EL layer for emitting a red color light over the plurality of first pixel electrodes, the first EL layer extending along the first separation layer and the second separation layer;
a second EL layer for emitting a green color light over the plurality of second pixel electrodes, the second EL layer extending along the second separation layer and the third separation layer; and
a third EL layer for emitting a blue color light over the plurality of third pixel electrodes, the third EL layer extending along the third separation layer and the fourth separation layer,
wherein the first EL layer is formed to be continuous over the plurality of first pixel electrodes and has an oblong shape or a rectangular shape corresponding to the plurality of first pixel electrodes,
wherein the second EL layer is formed to be continuous over the plurality of second pixel electrodes and has an oblong shape or a rectangular shape corresponding to the plurality of second pixel electrodes,
wherein the third EL layer is formed to be continuous over the plurality of second pixel electrodes and has an oblong shape or a rectangular shape corresponding to the plurality of third pixel electrodes.

35. A light-emitting device according to claim 34, wherein the second passivation film is formed for preventing transmission of alkali metals.

36. A device according to claim 35,
wherein a first gap between adjacent pixels of a plurality of first pixels is in a range of 5 to 10 times of a thickness of the first EL layer,
wherein a second gap between adjacent pixels of a plurality of second pixels is in a range of 5 to 10 times of a thickness of the second EL layer, and
wherein a third gap between adjacent pixels of a plurality of third pixels is in a range of 5 to 10 times of a thickness of the third EL layer.

37. A device according to claim 36, wherein the gap is in a range of 250-2500 nm.

38. A device according to claim 35, wherein each of the first, second and third EL layers comprises an organic material.

39. A device according to claim 34,
wherein a gap between adjacent pixels of a plurality of first pixels is in a range of 5 to 10 times of a thickness of the first EL layer,
wherein a gap between adjacent pixels of a plurality of second pixels is in a range of 5 to 10 times of a thickness of the second EL layer, and
wherein a gap between adjacent pixels of a plurality of third pixels is in a range of 5 to 10 times of a thickness of the third EL layer.

40. A device according to claim 39, wherein the gap is in a range of 250-2500 nm.

41. A device according to claim 34, wherein each of the first, second and third EL layers comprises an organic material.

42. A device according to claim 34, wherein the second passivation film comprises an organic resin material.

43. A device according to claim 34, wherein the second passivation film comprises at least one element selected from die group consisting of B (boron), C (carbon), and N (nitrogen), Al (aluminum), Si (silicon), and P (phosphorous).

44. A device according to claim 34, wherein the second passivation film comprises Si, Al, N, O, and M, wherein M denotes at least one rare earth element.

45. A light-emitting device comprising:
a plurality of TFTs over a substrate;
a first passivation film over the plurality of TFTs;
a leveling film over the first passivation film;
a second passivation film over the leveling film;
a plurality of first pixel electrodes and a plurality of second pixel electrodes over the second passivation film, the plurality of first pixel electrodes and the plurality of second pixel electrodes each being connected to one of the plurality of TFTs;
a first separation layer, a second separation layer and a third separation layer each extending in a line over the second passivation film so that the plurality of first electrodes are arranged between the first separation layer and the second separation layer and the plurality of second electrodes are arranged between the second separation layer and the third separation layer;
a first EL layer over the plurality of first pixel electrodes, the first EL layer extending along the first separation layer and the second separation layer; and
a second EL layer over the plurality of second pixel electrodes, the second EL layer extending along the second separation layer and the third separation layer,
wherein the first EL layer is formed to be continuous over the plurality of first pixel electrodes,
wherein the second EL layer is formed to be continuous over the plurality of second pixel electrodes, and
wherein the cathode is in contact with the first to third separation layers.

46. A light-emitting device according to claim 45,
wherein the second passivation film is formed for preventing transmission of alkali metals.

47. A device according to claim 46,
wherein a gap between adjacent pixels of a plurality of pixels is in a range of 5 to 10 times of a thickness of at least one of the first EL layer and the second EL layer.

48. A device according to claim 47, wherein the gap is in a range of 250-2500 nm.

49. A device according to claim 46, wherein each of the first and second EL layers comprises an organic material.

50. A device according to claim 45,
wherein a gap between adjacent pixels of a plurality of pixels is in a range of 5 to 10 times of a thickness of the first EL layer, and
wherein a gap between adjacent pixels of a plurality of pixels is in a range of 5 to 10 times of a thickness of the second EL layer.

51. A device according to claim 50, wherein the gap is in a range of 250-2500 nm.

52. A device according to claim 45, wherein each of the first and second EL layers comprises an organic material.

53. A device according to claim 45, wherein the second passivation film comprises an organic resin material.

54. A device according to claim 45, wherein the second passivation film comprises at least one element selected from the group consisting of B (boron), C (carbon), and N (nitrogen), Al (aluminum), Si (silicon), and P (phosphorous).

55. A device according to claim 45, wherein the second passivation film comprises Si, Al, N, O, and M, wherein M denotes at least one rare earth element.

* * * * *